United States Patent [19]
Lee et al.

[11] Patent Number: 5,777,923
[45] Date of Patent: Jul. 7, 1998

[54] FLASH MEMORY READ/WRITE CONTROLLER

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 664,639

[22] Filed: Jun. 17, 1996

[51] Int. Cl.$^6$ .................................. G11C 11/34
[52] U.S. Cl. .......................... 365/185.11; 365/185.18; 365/185.21; 365/185.33
[58] Field of Search .................. 365/185.11, 185.2, 365/185.21, 185.22, 185.18, 185.33

[56] References Cited

U.S. PATENT DOCUMENTS

| | | | |
|---|---|---|---|
| 4,698,787 | 10/1987 | Mukherjee et al. | 365/185.29 |
| 4,888,734 | 12/1989 | Lee et al. | 365/185.02 |
| 4,949,309 | 8/1990 | Rao | 365/218 |
| 4,996,571 | 2/1991 | Kume et al. | 357/23.5 |
| 5,097,444 | 3/1992 | Fong | 365/185.12 |
| 5,109,361 | 4/1992 | Yim et al. | 365/218 |
| 5,185,718 | 2/1993 | Rinerson et al. | 365/185.12 |
| 5,191,556 | 3/1993 | Radjy | 365/235 |
| 5,337,281 | 8/1994 | Kobayashi et al. | 365/185.33 |
| 5,396,459 | 3/1995 | Arakawa | 365/185.29 |
| 5,491,656 | 2/1996 | Sawada | 365/185.29 |

*Primary Examiner*—Joseph A. Popek
*Attorney, Agent, or Firm*—Flehr Hohbach Test Albritton & Herbert LLP

[57] ABSTRACT

A flash memory includes a flash transistor array, a wordline decoder, a bitline decoder, a sourceline decoder and a read/write controller. The read/write controller has a voltage terminal to receive an input voltage and a data terminal to receive a new data signal. A sense amplifier is coupled to the bitline decoder and configured to sense a signal on a selected bitline and to generate an internal old data signal. A data comparator is coupled to the data terminal and the sense amplifier and configured to compare the new data signal to the old data signal and to generate a comparator signal. A voltage generator is configured to selectively apply one of a read set of voltages to read a selected cell in the flash transistor array, a program set of voltages to program a selected cell and an erase set of voltages to erase a selected cell. In a multistate embodiment, the read/write controller further includes a step counter configured to generate a plurality of step counts. The voltage generator is coupled to the step counter and configured to generate a wordline high voltage (WLHV) signal based on the step count. The WLHV signal is delivered to a selected multistate cell by the wordline decoder to read the contents of the selected multistate cell. Each step compares the old data and the new data in order to determine which memory cells to change. Advantages of the invention include increased flexibility of programming and erasing and improved memory longevity.

22 Claims, 23 Drawing Sheets

Y-MUX CIRCUIT

"+" MEANS OUT = IN
"." MEANS OUT = FLOATIN

5,777,923

FLASH MEMORY READ/WRITE CONTROLLER

FIELD

The present invention relates to a flash electrically erasable programmable read only memory (EEPROM) read/write controller. In particular, the flash memory read/write controller compares preexisting memory data to new write data in order to selectively write the new data to memory.

BACKGROUND

Flash memories are becoming increasingly popular because they can store information in the absence of continuous power and they can be constructed in compact form. In essence, a flash memory is an electrically erasable programmable read only memories (EEPROM) that supports three operations: read, program and erase. For a detailed description of flash-type transistors, see Yim, U.S. Pat. No. 5,109,361 assigned to SamSung Electronics.

A conventional flash memory is formed by rows and columns of flash transistors. A wordline decoder provides operational voltages to rows that are coupled to the gates of the transistors, while a bitline decoder provides operational voltages to columns that are coupled to the drains of the transistors. Generally, the sources of the transistors are coupled to a common sourceline and are controlled by a sourceline controller.

The writing operation of a flash memory conventionally comprises two procedures: an erase procedure and a program procedure. These procedures correspond to decreasing and increasing the threshold voltage of a memory cell, respectively. Because the data stored in each memory cell is determined by the cell's threshold voltage, when the threshold voltage is higher (or lower) than a read voltage which is applied to a word line connected to the gate of the cell, the channel of the cell, which is between a drain and a source region, will be turned off (or on) and then the channel current is sensed by a sense amplifier to determine the data "1" (or "0"). The writing operation corresponds to determining the threshold voltage of the memory cells. Two well known electronic effects are widely used to change the threshold voltage of a cell. They are Fowler-Nordheim tunneling (F-N) and channel hot-electron (CHE) injection. By using the two effects, electrons can be injected to a floating gage from a channel or diffusion region to increase the threshold voltage, or injected from the floating gate to the diffusion region to decrease the threshold voltage.

Known flash memories have several drawbacks. Some known flash memories perform block program and erase functions to initialize the entire memory into a predetermined state prior to programming the memory with new data. There is no flexibility to select arbitrary words or bits within a block to be efficiently erased or programmed. An example is given in Table 1, where the old data is characterized as "00001111" and the new data is characterized as "10101010."

TABLE 1

| Time | erase=0 | erase=1 |
|---|---|---|
| t=1 | 00001111 | 00001111 |
| t=2 (erase) | 00000000 | 11111111 |
| t=3 (program) | 10101010 | 10101010 |

When large blocks are set to a specific state, an overerase problem is caused. Since some of the transistors initially have high thresholds and some have low, an operation to set all the thresholds low may cause those transistors that were already set low, to become negative. That is, some of the transistors will be overerased. Then, when the transistors are read, the overerased transistors will be always on since even a ground gate line will provide enough voltage to turn on the overerased transistors. This causes a problem because it removes the selectability of the memory cells from the wordline decoder in a conventional NOR plane flash memory array.

In an attempt to avoid the overerase problem, other known flash memories perform two block program and erase functions to initialize the entire memory into a predetermined state prior to programming the memory with new data. There is no flexibility to select arbitrary words or bits within a block to be efficiently erased or programmed. An example is given in Table 2, where the old data is characterized as "00001111" and the new data is characterized as "10101010."

TABLE 2

| Time | erase=0 | erase=1 |
|---|---|---|
| t=0 | 00001111 | 00001111 |
| t=1 (precondition) | 11111111 | 00000000 |
| t=2 (erase) | 00000000 | 11111111 |
| t=3 (program) | 10101010 | 10101010 |

This technique is very time consuming and does not overcome the overerase problem in an efficient manner.

A related problem with known wordline decoders is that since large portions (pages) of the memory are erased and programmed in order to change only a small portion of memory, unnecessary erasing and programming procedures are performed over a large portion of memory. For example, to change 8 memory cell values in a 2 Kb page requires that 2048 cells are re-programmed just to change the value for 8 cells. This re-programming of the cells reduces the endurance of the memory.

Goals of the invention are to overcome the identified problems and to provide a new design for a flash memory read/write controller.

SUMMARY

The invention overcomes the identified problems and provides a flash memory read/write controller that is bit-erasable and bit-programmable.

An exemplary embodiment of a flash memory includes a flash transistor array, a wordline decoder, a bitline decoder, a sourceline decoder and a read/write controller. The read/write controller has a voltage terminal to receive an input voltage and a data terminal to receive a new data signal. A sense amplifier is coupled to the bitline decoder and configured to sense a signal on a selected bitline and to generate an internal old data signal. A data comparator is coupled to the data terminal and the sense amplifier and configured to compare the new data signal to the old data signal and to generate a comparator signal. A voltage generator is coupled to the voltage terminal, the wordline decoder, the bitline decoder and the sourceline decoder and configured to selectively apply one of a read set of voltages to read a selected cell in erase/program flash transistor array, a program set of voltages to program a selected cell in erase/program flash transistor array and an erase set of voltages to erase a selected cell in erase/program flash transistor array.

In a multistate embodiment, the read/write controller further includes a step counter configured to generate a plurality of step counts. The voltage generator is coupled to the step counter and configured to generate a wordline high voltage (WLHV) signal based on the step count. The WLHV signal is delivered to a selected multistate cell by the wordline decoder to read the contents of the selected multistate cell. Each step compares the old data and the new data in order to determine which memory cells to change.

The exemplary embodiments can be combined with a voltage pump generator. A voltage pump generator provides operational voltages that are derived from the supplied voltages. For example, if the memory is supplied with +3 V, and needs +10 V for a program function, the voltage pump generator creates the required voltage and provides it to the decoder circuits to accomplish the necessary function. Likewise, the voltage pump can provide a negative voltage to the decoder circuits for the erase function.

Advantages of the invention include increased flexibility of programming and erasing and improved memory longevity. The read/write controller also reduces erase/program cycle time and improves expected lifetime of the flash memory due to reduced stress on the flash transistors within the flash memory.

BRIEF DESCRIPTION OF THE FIGURES

Additional advantages of the invention will become apparent upon reading the following detailed description and upon reference to the figures, in which.

DETAILED DESCRIPTION

Exemplary embodiments are described with reference to specific configurations. Those skilled in the art will appreciate that various changes and modifications can be made while remaining within the scope of the claims. For example, the invention can be used with any type of flash memory using Fowler-Nordheim (F-N) tunneling and channel hot electron (CHE) for erase and programming. Note that the traditional decision that an erased state is a low threshold transistor and that a programmed state is a high threshold transistor is arbitrary. However, the invention can also be practiced where an erased state is considered to be one where the transistor has a high threshold while a programmed state is considered one where the transistor has a low threshold. All electrical parameters are given by example and can be modified with good results. For example, in the exemplary embodiments, a supply voltage (VDD) is considered as 5 V, but could alternatively be 3 V, 1.5 V or other supply voltage. If a different supply voltage is chosen, the various operational voltage levels would be modified to reflect the different supply voltage.

FLASH MEMORY ARCHITECTURE

Figure 1:
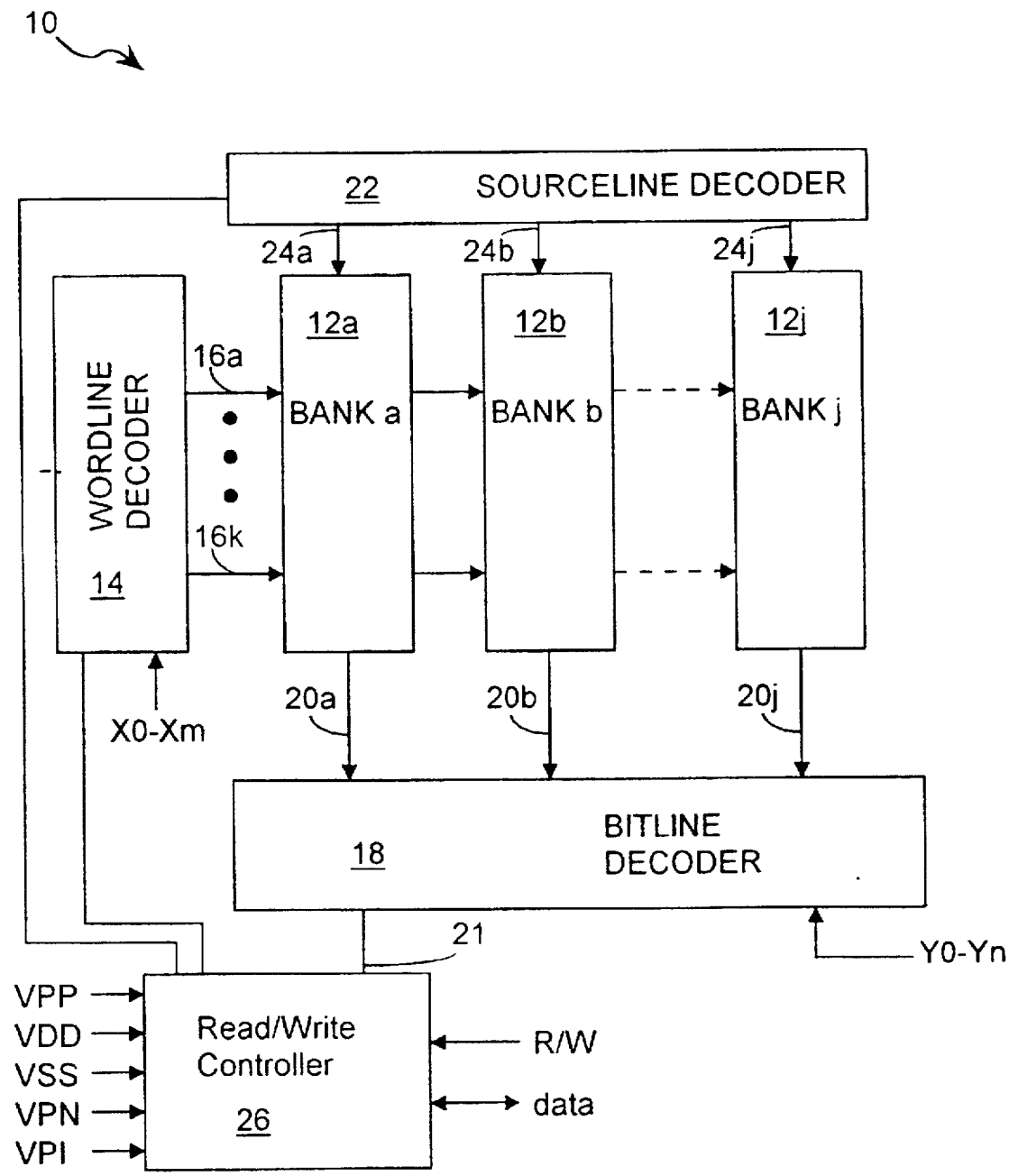
FIG. 1 depicts a multi-bank flash memory incorporating an embodiment of the invention.

FIG. 1 depicts a flash memory 10 incorporating an embodiment of the invention. Flash memory 10 includes a plurality of banks of flash transistors 12a-j that store information. Each bank is constructed similar to a traditional flash transistor array, with rows and columns of flash transistors.

A wordline decoder 14 is coupled to the banks 12a-j by wordlines 16a-k which are selected by an address input XO-Xm. The wordlines are coupled to the gates of the transistors in the banks. A bitline decoder 18 is coupled to the banks 12a-j by bitlines 20a-j which are selected by an address input YO-Yn. Bitlines 20a-j are coupled to the drains of the transistors in the banks and each typically include a plurality of bitlines that represent a word. A sourceline decoder 22 is coupled to the banks 12a-j by sourcelines 24a-j. A read/write controller 26 is coupled to wordline decoder 14, bitline decoder 18 and sourceline decoder 22. Controller 26 receives voltage inputs and provides selected voltage outputs to the decoders. Moreover, controller 26 provides the data interface in order to read from the banks and write to the banks.

Figure 2A:
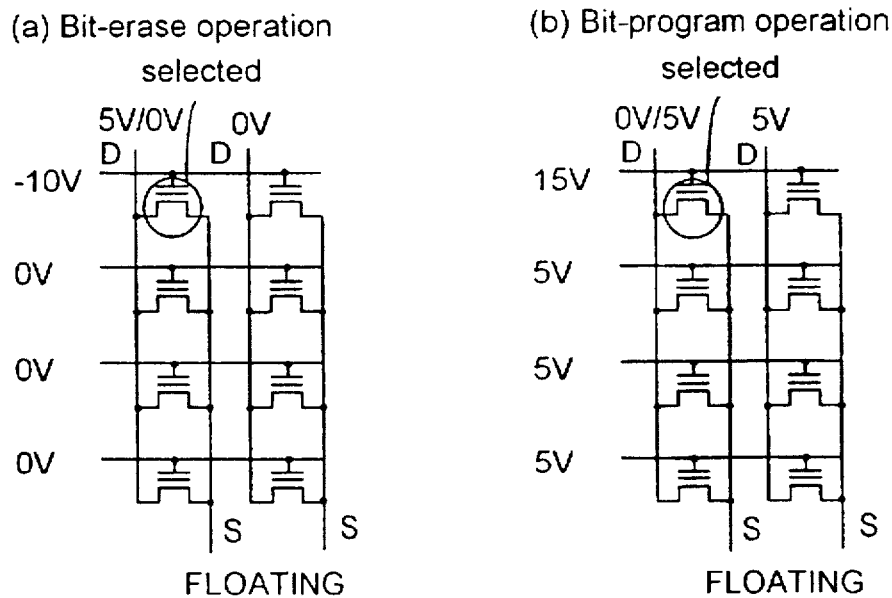
FIGS. 2A-B depict flash transistor configurations in the flash memory array.
Figure 2B:
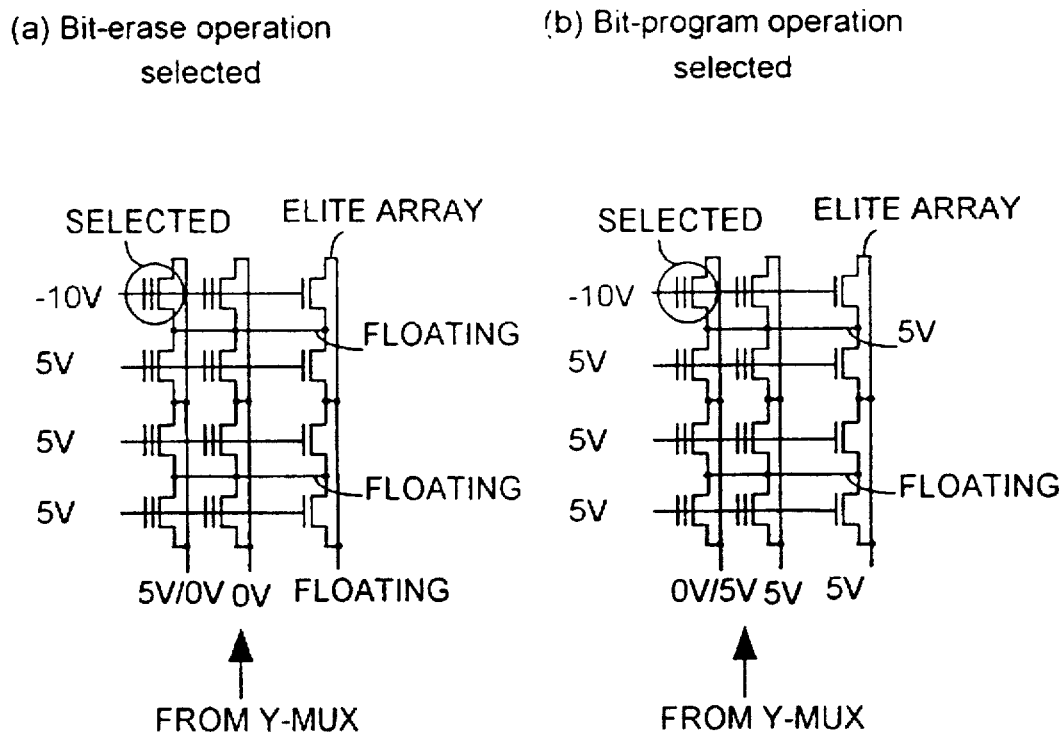

The flash transistor banks are constructed according to the configurations shown in FIGS. 2A-B. FIG. 2A depicts an AND plane and FIG. 2B depicts a NOR plane. In FIG. 2A, both erasing and programming are bit selectable by applying data on the drain of the selected cells. In FIG. 2B, an elite array is added (described below with reference to FIG. 11). For a discussion of flash memory transistors, see Yim, U.S. Pat. No. 5,109,361 assigned to SamSung Electronics.

There are two methods to implement a bit-erasable, bit-programmable memory array. One uses an AND plane with drain-side F-N tunneling in both erase and programming. The other one uses a NOR plane with drain-side F-N tunneling in erasure and source-side CHE in programming. FIGS. 2A–B show bias conditions for the AND plane and the NOR plane, respectively. The NOR plane in FIG. 2B can be constructed as a DINOR plane, dial-string NOR plane or other type of NOR plane. Moreover, P-channel memory cells can be implemented as well, with a modification of bias conditions. Note that, because both the erase and program operations can be bit-selective in this invention, the increasing (or decreasing) of cell's threshold voltage can be named either erasure or programming (with contrast, in the prior arts, the erasure generally means that the operation is taken in a block size and the programming means that the operation is cell-selective). For clarity, in this document, an erase operation is defined as the operation which decreases a cell's threshold voltage, and a program operation is defined as the operation which increases a cell's threshold voltage. Tables 3A–B summarize the bias conditions for the bit-erase/bit-program operations for an AND plane and a NOR plane, respectively. The read/write circuit for an AND plane and a NOR plane will be described in the following embodiments. Table 3A is for an AND plane (F-N erase and F-N program).

TABLE 3A

| | wordline selected/unselected | bitline selected/unselected | sourceline selected/unselected |
|---|---|---|---|
| erase | −10V/0V | 5V/0V | floating/floating |
| program | 15V/5V | 0V/5V | floating/floating |
| read | 5V/0V | 1V/floating | 0V/floating |

Table 3B is for a NOR plane (F-N erase, CHE Program).

TABLE 3B

| | word line selected/unselected | bit line selected/unselected | source line selected/unselected |
|---|---|---|---|
| erase | −10V/0V | 5V/0V | floating/floating |
| program | 10V/0V | 0V/5V | 5V/floating |
| read | 5V/0V | 1V/floating | 0V/floating |

Note that in both the AND plane and the NOR plane, the bitline voltages are the same. The read/write controller described herein can operate on any type of flash memory array. A person skilled in the art will recognize that any bitline voltages can be implemented according to the structure and function described.

TWO STATE MEMORY

To overcome the identified problems, read/write controller 26 is capable of controlling an erase procedure and a program procedure for each bit in the memory array 12. An example is given with reference to Table 4, where the old data is characterized as "00001111" and the new data is characterized as "10101010."

TABLE 4

| Time | erase=0 | erase=1 |
|---|---|---|
| t=0 | 00001111 | 00001111 |
| t=1 (erase) | 00001010 | 10101111 |
| t=2 (program) | 10101010 | 10101010 |

Note that the erase and program procedures affect only those bits that need to be changed. As a result, the memory data is efficiently changed to the new data in a short time and without any overerase problems.

Figure 3:
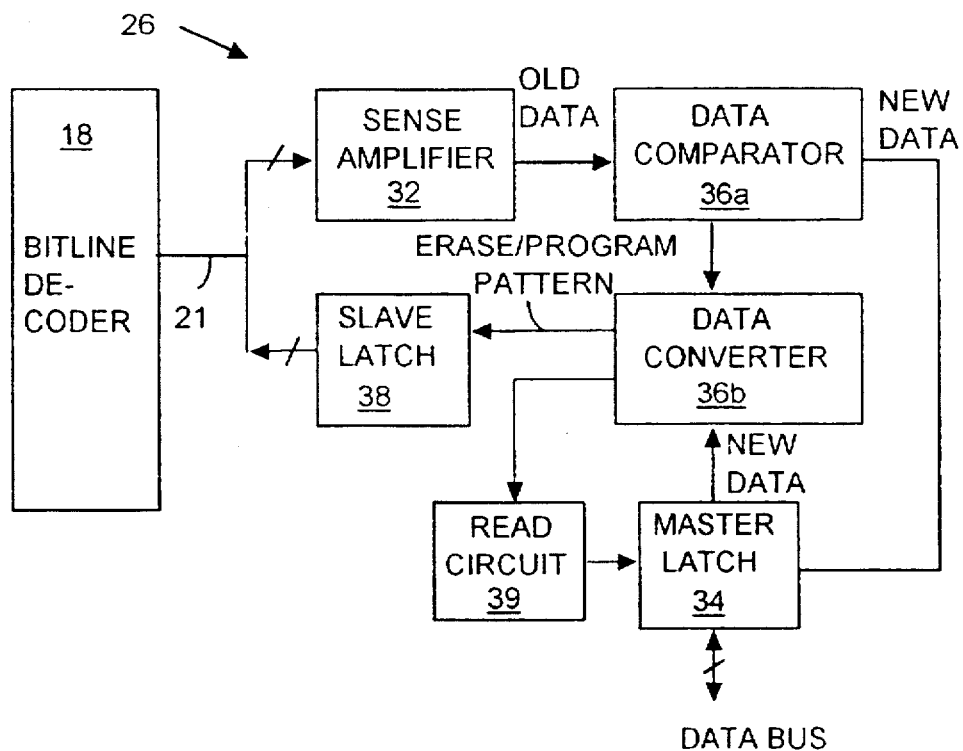
FIG. 3 depicts a block diagram of a read/write controller according to an embodiment of the invention.

Referring to FIG. 3, controller 26 includes sense amplifier 32 that senses the old data in the memory. As master latch 34 receives the new data from an external source and latches the new data. A data comparator 36a compares the old data and the new data. If the data is the same, no procedure is initiated. If, however, the data is different then the new data is latched by slave latch 38 and the memory is programmed with the new data.

Figure 4:
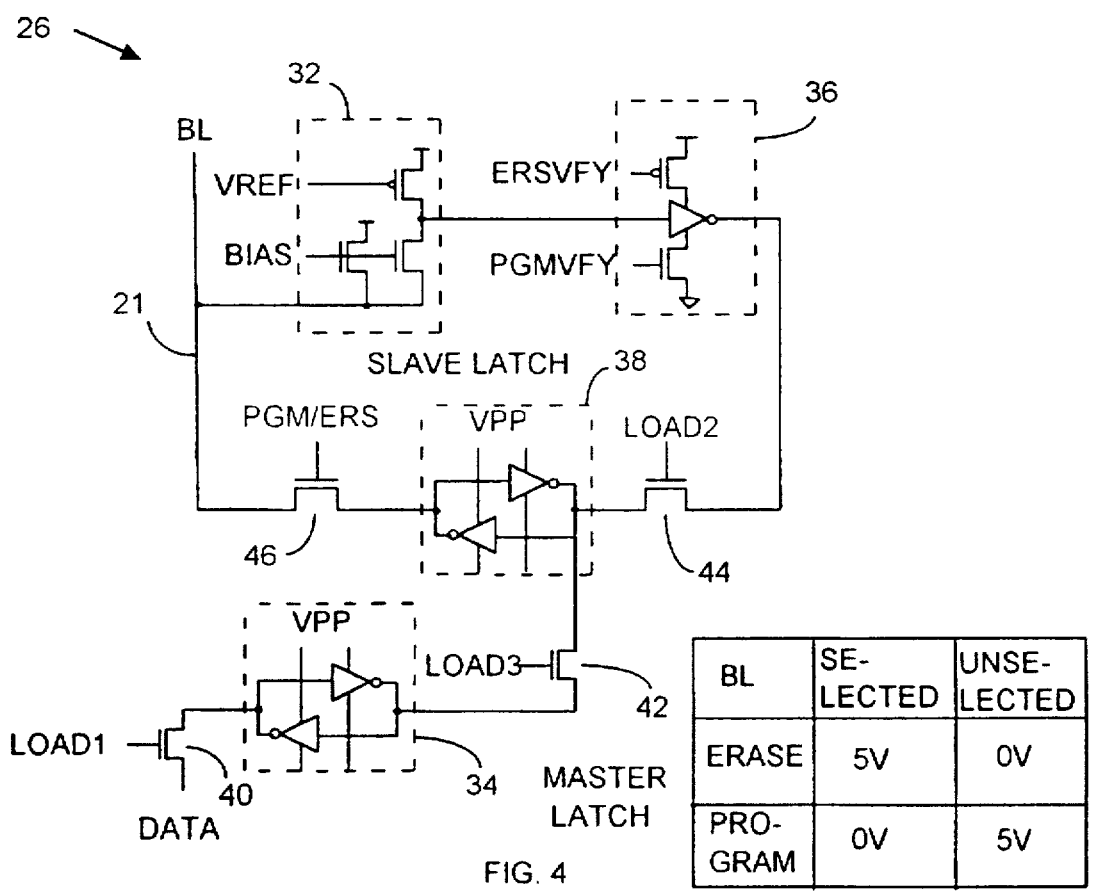
FIG. 4 depicts an implementation of the read/write controller according to the embodiment of FIG. 3.

FIG. 4 depicts an implementation of the read/write controller 26. Sense amplifier 32 includes a reference transistor and a bias transistor. This is to detect whether a selected transistor in array 12 is turned on or off. Essentially, sense amplifier 32 is a pull-up circuit that is designed weaker than the memory cell, which is a pull-down circuit. When the memory cell turns on and pulls down bitline 20a, sense amplifier 32 generates a signal indicative of the bitline signal. For example, when a memory cell is off, bitline 20a is high and sense amplifier 32 provides a high signal, and when a memory cell is on, bitline 20a is low and sense amplifier 32 provides a low signal.

The data comparator 36a and data converter 36b are combined in data comparator 36. Comparator 36 includes a pull-up circuit controlled by an ERSVY signal and a pull-down circuit controlled by a PGMVY signal. The comparator 36 operates according to Table 5, where N1 is old data and X blocks N1 from affecting N2, and N2 floats.

TABLE 5

| Procedure | ERSVY | PGMVY | N2 (N1=0) | N2 (N1=1) |
|---|---|---|---|---|
| pass | 0 | 1 | 1 | 0 |
| erase-verify | 0 | 0 | 1 | X |
| program-verify | 1 | 1 | X | 0 |
| data load | 1 | 0 | X | X |

Transistors 40, 42, 44 and 46 control the signal flow in the controller to allow the signals to set and reset master latch 34 and slave latch 38. Note that master latch 34 can set and reset slave latch 38 via transistor 42 and that comparator 36 can set and reset slave latch 38 via transistor 44. To avoid conflicting signals, it is recommended that transistors 42 and 44 are not simultaneously turned on.

Figure 5:
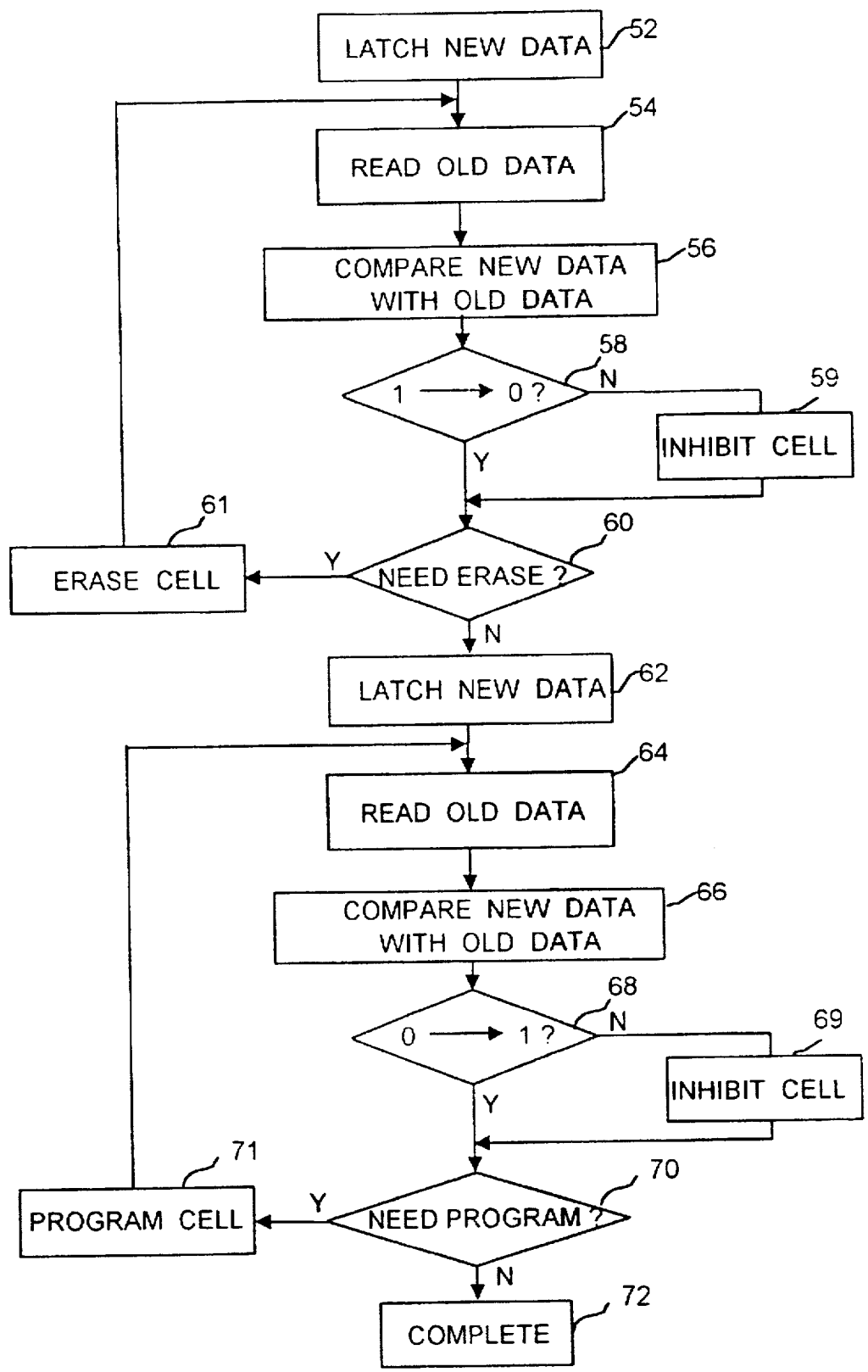
FIG. 5 is a flowchart showing operation of the read/write controller of FIG. 3.
Figure 6A:
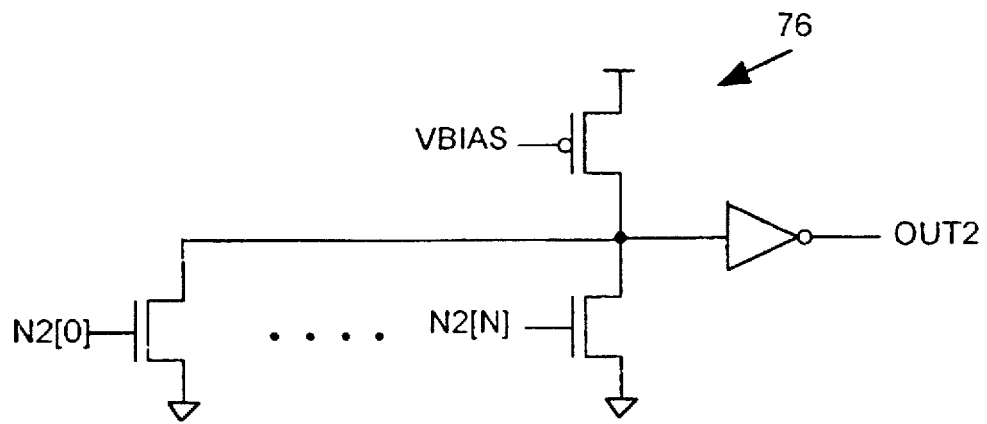
FIGS. 6A-B depicts verification circuits for use with the read/write controller of FIG. 3.

Referring to the flowchart of FIG. 5, a write procedure is explained. The write procedure is broken into an erase procedure and a program procedure. Refer to Table 5 for the ERSVY and PGMVY states for the erase and program procedures. For the erase procedure, beginning with step 52, new data is received from an external source and is latched at the master latch and transferred to the slave latch (transistors 40, 42, 44, and 46 are set as 1, 1, 0, 0). At step 54, old data is read internally from the memory (0, 0, 0, 0). In step 56, the old data is compared to the new data (0, 0, 1, 0). Step 58 determines if the memory cell must be erased to change the data from a 1 to a 0 (if slave=1). This is done using Table 5 where the old data (if N1=0 then N2=1) can reset slave latch 38 (to 0) if the cell is already at a 0 state. This is called an inhibit erase and reflects the procedure of step 59. Step 60 is performed to check if there are any cells that need to be erased. The FIG. 6A circuit 76 is used to check slave latch 38. If latch 38 is at a 1 state, circuit 76 outputs a 1 signal and step 61 is performed to erase the cell. Step 61 instructs the decoders to apply the erase voltages on selected wordlines, bitlines and sourcelines to erase the memory cell (0, 0, 0, 1). If the cell is not erase inhibited, the cell is erased. If latch 38 is already at a 0 state, circuit 76 outputs a 0 signal to skip step 61, and step 62 is performed.

Figure 6B:
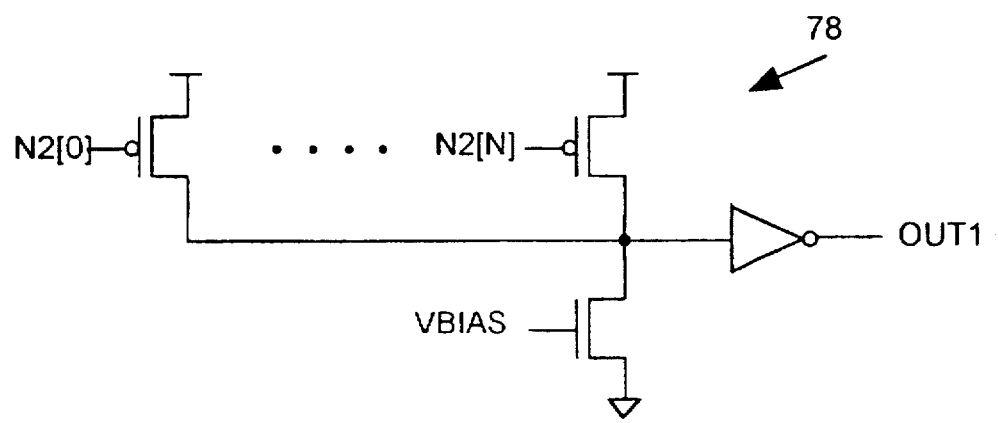

To program the required cells, step 62 is performed to latch the new data from the master latch to the slave latch (0, 1, 0, 0). At step 64, old data is read internally from the memory (0, 0, 0, 0). In step 66, the old data is compared to the new data (0, 0, 1, 0). Step 68 determines if the memory cell must be programmed to change the data from a 0 to a 1 (if slave=0). This is done using Table 5 where the old data (if N1=1 then N2=0) can reset slave latch 38 (to 1) if the cell is already at a 1 state. This is called an inhibit program and reflects the procedure of step 69. Step 70 is performed to check if there are any cells that need to be programmed. The FIG. 6B circuit 78 is used to check slave latch 38. If latch 38 is at a 0 state, circuit 78 outputs a 0 signal and step 71 is performed to program the cell. Step 71 instructs the decoders to apply the program voltages on selected wordlines, bitlines and sourcelines to program the memory cell (0, 0, 0, 1). If the cell is not program inhibited, the cell is programmed. If latch 38 is already at a 1 state, circuit 78 outputs a 1 signal to skip step 71, and step 72 is performed to complete the procedure.

There are some operational differences between an implementation using an AND plane and an implementation using a NOR plane. First, in the AND plane embodiment, the source-side of the cells are floating in both the erase and program operations. Therefore, the simple circuit shown in FIG. 4 can be used. However, in this embodiment where a source-side CHE programming is utilized, the source line voltage must also be controlled. Second, in the AND plane embodiment, because the erase/program current is low, due to the nature of F-N tunneling, both the erase and program operations can be done simultaneously for many cells.

Figure 7:
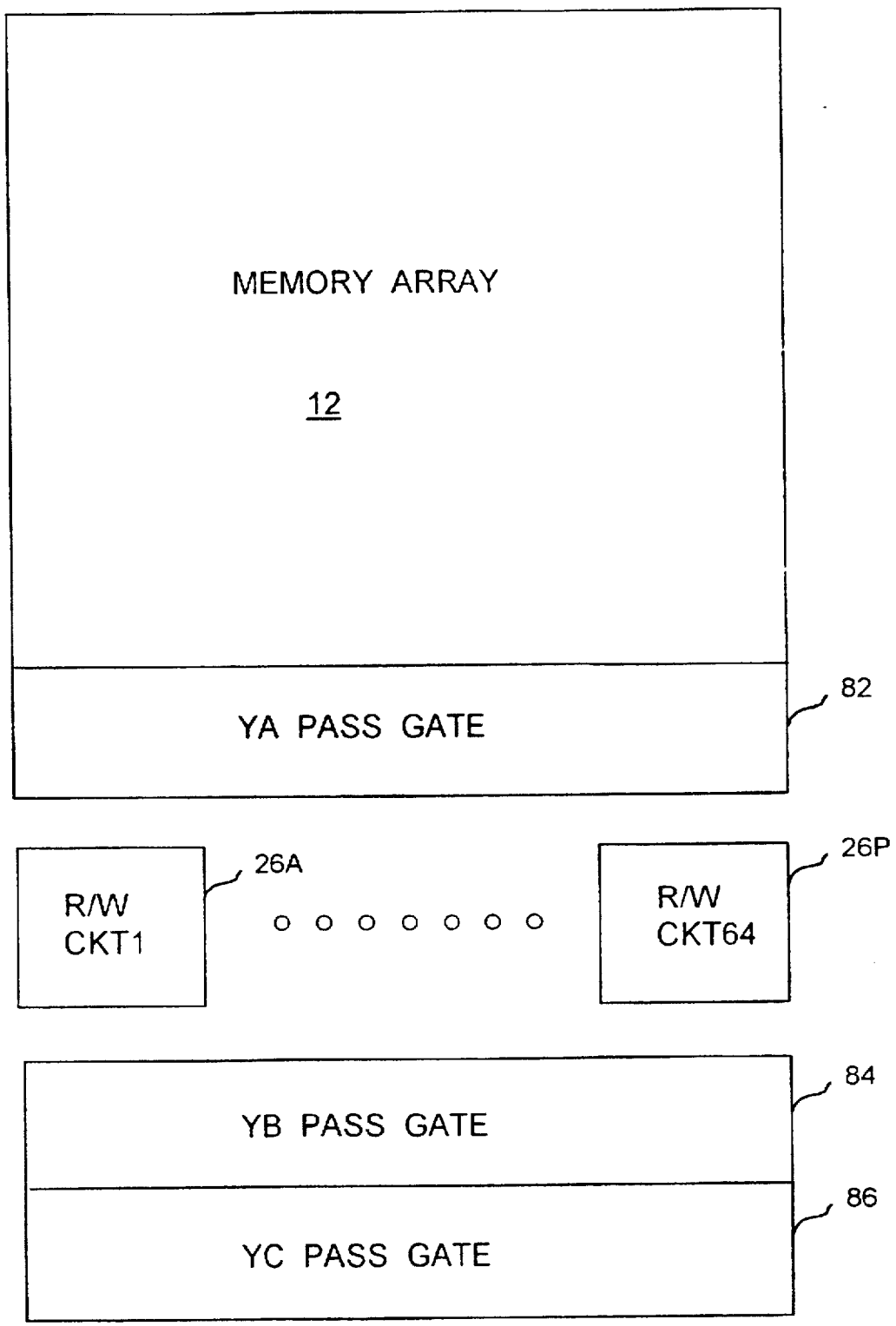
FIG. 7 depicts a multi-bank flash memory incorporating an embodiment of the invention.
Figure 8A:
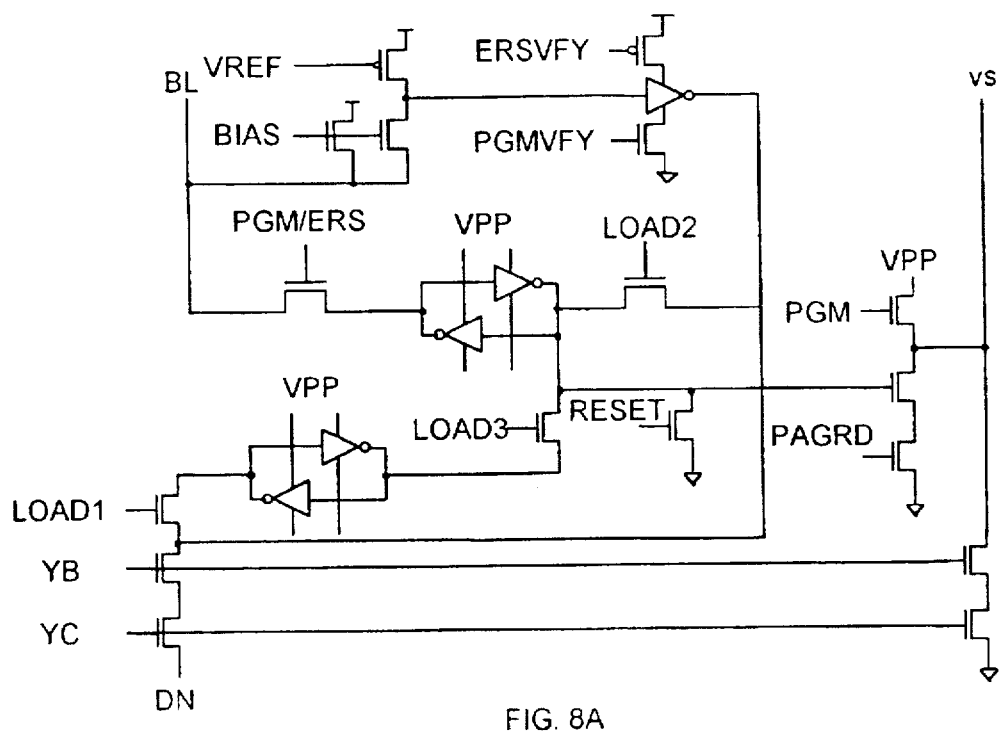
FIGS. 8A-B depict page read/write controllers according to embodiments of the invention.

Referring to FIG. 7, a technique to organize the read/write circuit in a memory array is presented. A predetermined number (such as 64) read/write circuits are used in order to reduce the writing time. Three-stage decoder, ya-, ab- and yc- pass gates (82, 84, 86) are used. The ya-decoder selects one bit line out of a predetermined number (such as, 8) of bit lines to be connected to a read/write circuits. The yb- and yc- decoder select one byte of the read/write circuits to be connected to the data bus. This organization gives functions of page-load, page-erasure, and page-programming. A "page" is defined as a predetermined number of cells which belong to a word line or a portion of a word line, such as 64 byte, etc. The page-operation means that all the cells in a page can be proceeded at the same time. The size of a page is determined by how many read/write circuits are used. Because each bit line has its own read/write circuit, they can be operated simultaneously. With the page-operation, the micro-processor can be free from operations such as continuous data-loading. FIG. 8A shows a circuit for implementing the functions described above.

Figure 8B:
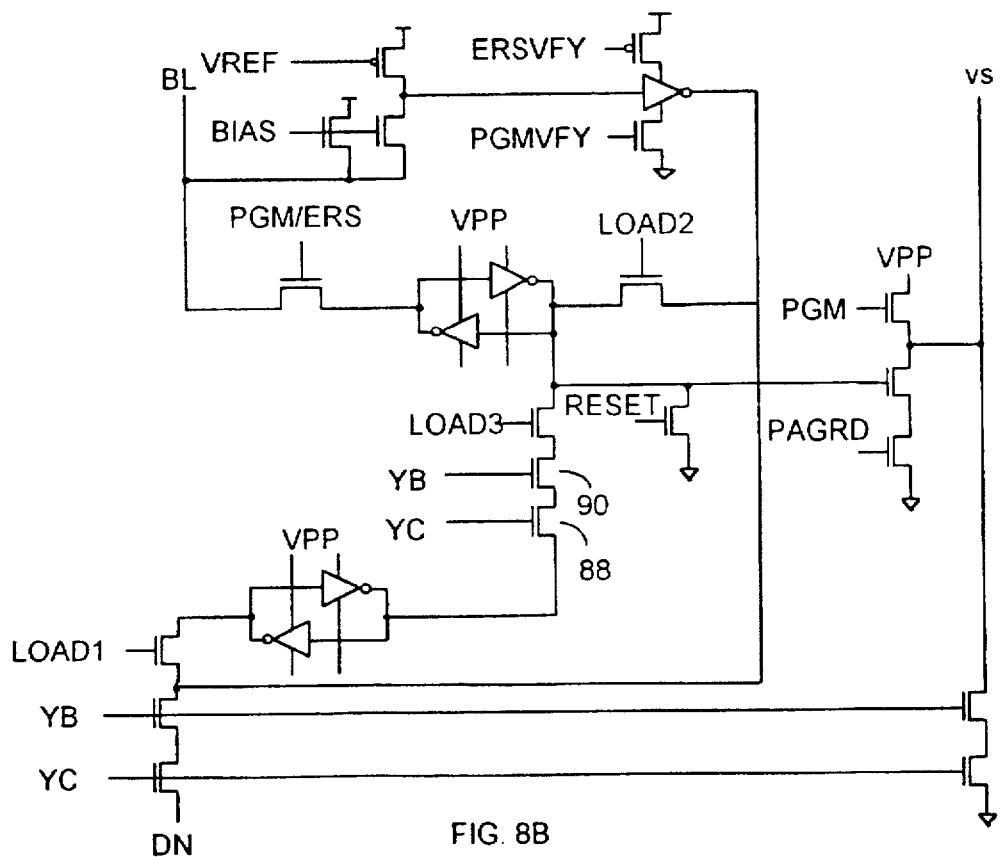

FIG. 8B shows another circuit for implementing the functions of page-load, page-erasure, and byte- (or any number of cells in a fraction of a page, which is defined as "sub-page" in this document) programming. The function of byte programming is related to memory arrays which cannot program too many cells at one time, due to some limitation such as the high-current-supply ability in a CHE programming. The data can be page-loaded so that the microprocessor is still free, but the page's data are divided into several sub-pages to be sequentially programmed in several times. For this type of application, series pass gates 88, 90 are added, thus, after a program verification is successful, the new data stored in the master latch 34 is transferred to the slave latch 38 one sub-page, instead of whole page, at a time. This sub-page is programmed and verified independently until the verification succeeds, then the next sub-page is loaded and programmed. These steps are repeated until the programming of all the sub-pages are completed.

Figure 9:
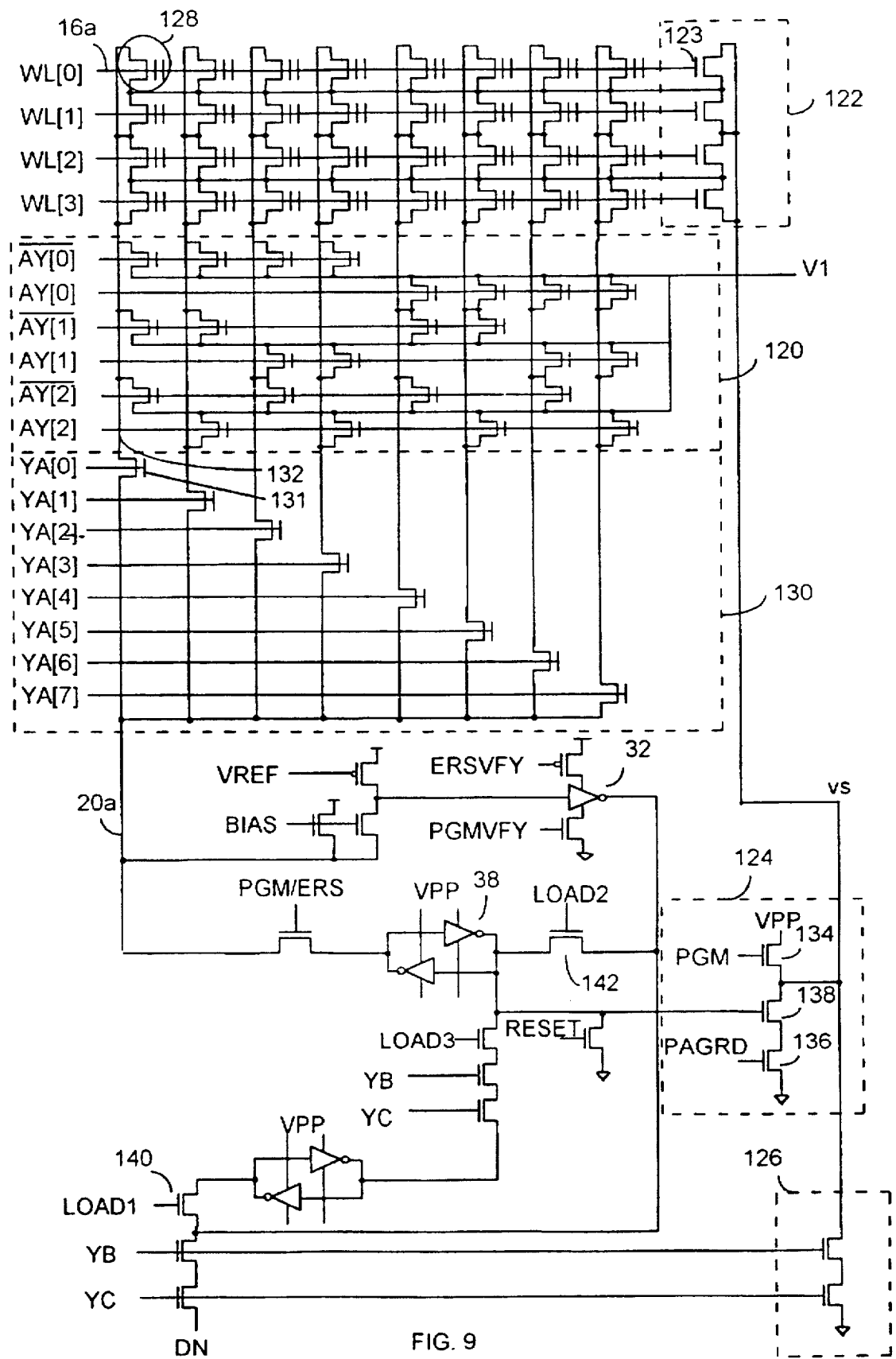
FIG. 9 shows a more detailed circuit diagram for the application of this invention in a NOR plane.

FIG. 9 shows a more detailed circuit diagram for the application of this invention in a NOR plane. The array is constructed with several features that include: a y-MUX (multiplexer) circuit 120 to supply the un-selected bit lines with proper bias condition for erase/program inhibition, an Elite array 122 (see Lee et al., U.S. Pat. No. 4,888,734 assigned to Elite Semiconductor) to minimize the time and the current consumption in charging the un-selected source lines, a source line voltage controller 124 to control the bias conditions of source lines, and an extra yb-, yc- pass gates 126 to decode the source line of the selected byte to reduce the DC current consumption in a read operation.

Figure 10:
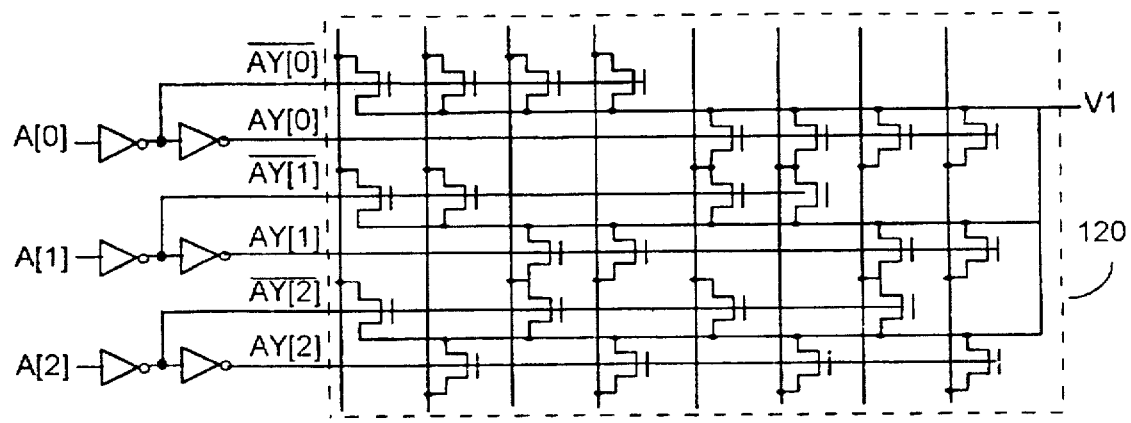
FIG. 10 shows an address decoder for the y-MUX of FIG. 9.

A detailed explanation of this circuit's operation is described below. In the erase operation, assume that the cell 128 is selected. The word line 16a is applied with negative high voltage and the others are grounded. Because the Elite array 122 is used, all the pass gates of the Elite array are turned off by the word lines and the source is floating. The slave latch 38, then applies 5V or 0V to the common bit line (node 20a) according to the pattern that is "1" (erased) or "0", respectively. Because the power supply of this invention is set at low VDD, such as 3 V, 5 V is relative high voltage and needs to be generated by a well-known charge-pump circuit. The 5 V is supplied by the p-channel of the slave latch. The ya-pass gates 130 selects only the ya-pass gate on, for example, corresponding to YA[0] transistor 131. Therefore, the common bit line voltage will be passed to the selected bit line (node 132). However, in known memories which do not have a y-MUX like 120, the deselected bit lines are floating. The floating bit lines exist a hazard of floating-high, that may cause the deselected cells to be erased. In the present invention, a y-MUX 120 is added to provide the deselected bit lines with voltage V1. The address decoder for the y-MUX is shown in FIG. 10. In this step, the signal V1 is ground, thus the deselected bit lines' drain is solid-ground for inhibition, which is better than floating. The voltage of YA[n] has to be driven by medium high voltage to gate 5 V to the selected bit line.

In the program operation, the selected word line 16a is applied with positive high voltage of about 10 V, thus all the cells connected to this word line, including the selected cell 128 and the pass gate 123 are on. Consequently, the common source line 24a must charge all the bit line capacitance through the pass gate and all the cells connected to the selected word line. However, considering a situation that the new data of the selected cell 128 is "1" (erased), so the cell does not need to be programmed by applying 5 V to its source-side, the voltage of the source line 24a can be VDD rather than 5 V to reduce power consumption. Therefore, the y-MUX sends VDD to the deselected bit lines, and the pass gates of the source voltage controller, 132 is on and 134 is off. For this setup, those slave latches they store pattern "0" (programmed) will turn on the pass gate 138 and then send 5 V to the source line 24a and, contrastly, those latches they store pattern "0" (erased) will turn off pass gate 138 and their bit lines are charged to only VDD by the y-MUX. The source voltage controller 124 can be modified according to different bias conditions for varied arrays and erase/program methods.

For the read operation, there are two types of read operation that can be achieved; they are byte-read and page-read. The byte-read format and the page-read format are commonly used in a NOR plane and an AND plane memories, respectively. In the byte-read format, the yb-, yc- data pass gates of the selected byte are on, and the pass gates 140 and 142 are off, thus, data is directly read from the sense amplifier 32 to the data bus without ratioing with the master and the slave latches. Another novel feature of this invention is that the source line 24a is also decoded by the yb-, yc- pass gates 126. Therefore, only the selected byte's source lines are discharged to ground; others will be floating to reduce power consumption. For known memories, all the bit lines' source lines are grounded, thus the DC current is consumed in the on-cells of every byte, regardless if the byte is selected or not.

In the page-read format, the pass gate 142 is on and the pass gate 140, yb-3, and yc-4 are off. The page's data is read and stored into the slave latch 38 of each read/write circuit. Then the yb-, yc- decoders will serially clock the page's data out from the slave latches as the pass gate 142 on and 140 off.

In the erase and/or program verification, the conditions of the bit lines' and the source lines' voltage is the same as the page-read condition, except that the word line's voltage is different. Due to the need of a voltage margin that off-cells' threshold voltage is desired to be higher and on-cell's voltage is desired to be lower than the read voltage, the erase-verify voltage and the program-verify voltage are higher and lower than the read voltage, respectively.

In another a byte load function is added to the page-load, page-erase, and page/byte-program functions to increase the flexibility of this invention without paying the penalty of increasing circuit's size. The byte-load function relates to a situation that only one byte's data needs to be changed and other bytes remained the same. This situation may occur in such a file where some specific variable data is stored in a specific address and which needs to be frequently updated. For those known memories that use the page-mode operations, the new data of the whole page must be re-loaded and programmed. In this invention, to gain the full advantage from the data comparison function of the read/write circuit, only the byte's new data is loaded. As a result, the loading time as well as the micro-processor's load are reduced.

To achieve this efficiency, the writing procedure mentioned in the prior embodiments add an additional step before the first step 52. Before the new byte's data is loaded, the page's data are read internally and stored in the slave latches 38. Then, the new byte's data is loaded. The new data will flip the old data stored in slave latch of the same accessed addressed only. Then the writing operation from steps 52 through 72 is started.

MULTISTATE MEMORY

Figure 11:
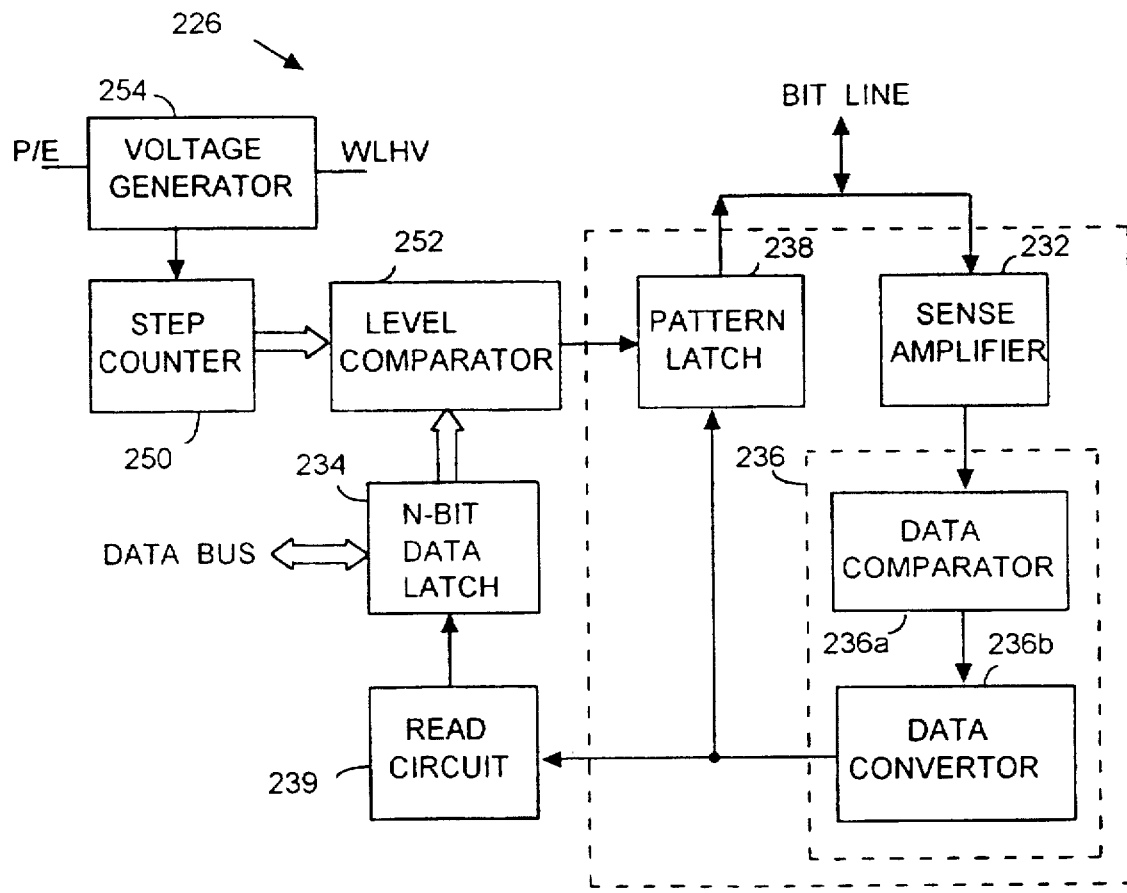
FIG. 11 depicts a read/write controller for a multistate flash memory.

A multistate memory is constructed similar to the two state memory described above. FIG. 11 depicts a read/write controller 226 for a multistate flash memory. This controller is similar to that depicted in FIG. 3, but with added components of a step counter 250 and a level comparator 252. Step counter 250 provides a plurality of steps to allow controller 226 to compare the current step count in proceeding (which relates to the WLHV signal) with new data to be programmed into the flash memory. Step counter 250 is coupled to a voltage generator 254 that provides a wordline high voltage (WLHV) signal to wordline decoder 14. The technique is to associate the new data with the WLHV signal for the erasing/programming step in order to determine whether the target threshold voltage of the selected cell for the present erasing/programming step is less than, equal to, or greater than the new data.

The operation of this circuit is based on page-load, page-erase (with selected pattern), and page-program (with selected pattern) to reduce the writing time and the unnecessary erasing/programming cycles. After a page of new data is loaded, the cells that need to be erased or programmed are automatically and directly erased or programmed without the pre-program option commonly used in known flash memories. The invention can also be used with a word-load, word-erase and word-program. The invention can even be used with a bit-load, bit-erase and bit-program. These operations will be understood by those skilled in the art as explained below.

Figure 12:
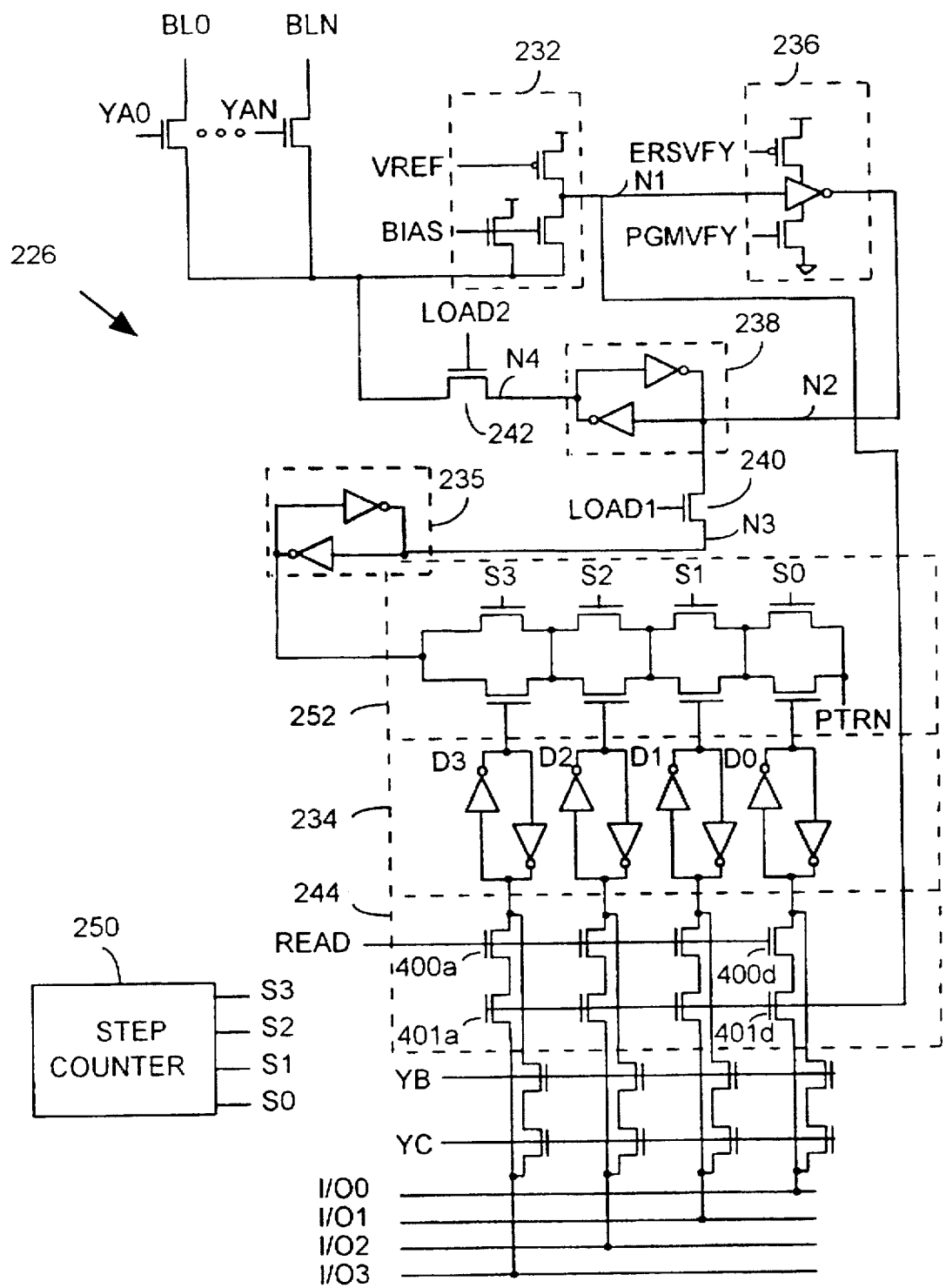
FIG. 12 depicts an implementation of the read/write controller of FIG. 11.

An implementation of read/write controller 226 is shown in FIG. 12. Data comparator 236a and data converter 236b are combined in data comparator 236. Comparator 236 includes a pull-up circuit controlled by an ERSVY signal and a pull-down circuit controlled by a PGMVY signal. The comparator 236 operates according to Table 6, where N1 is old data and X blocks N1 from affecting N2, and N2 floats.

TABLE 6

| Procedure | ERSVY | PGMVY | N2 (N1=0) | N2 (N1=1) |
|---|---|---|---|---|
| pass | 0 | 1 | 1 | 0 |
| erase | 0 | 0 | 1 | X |
| program | 1 | 1 | X | 0 |
| data load | 1 | 0 | X | X |

Figure 13A:
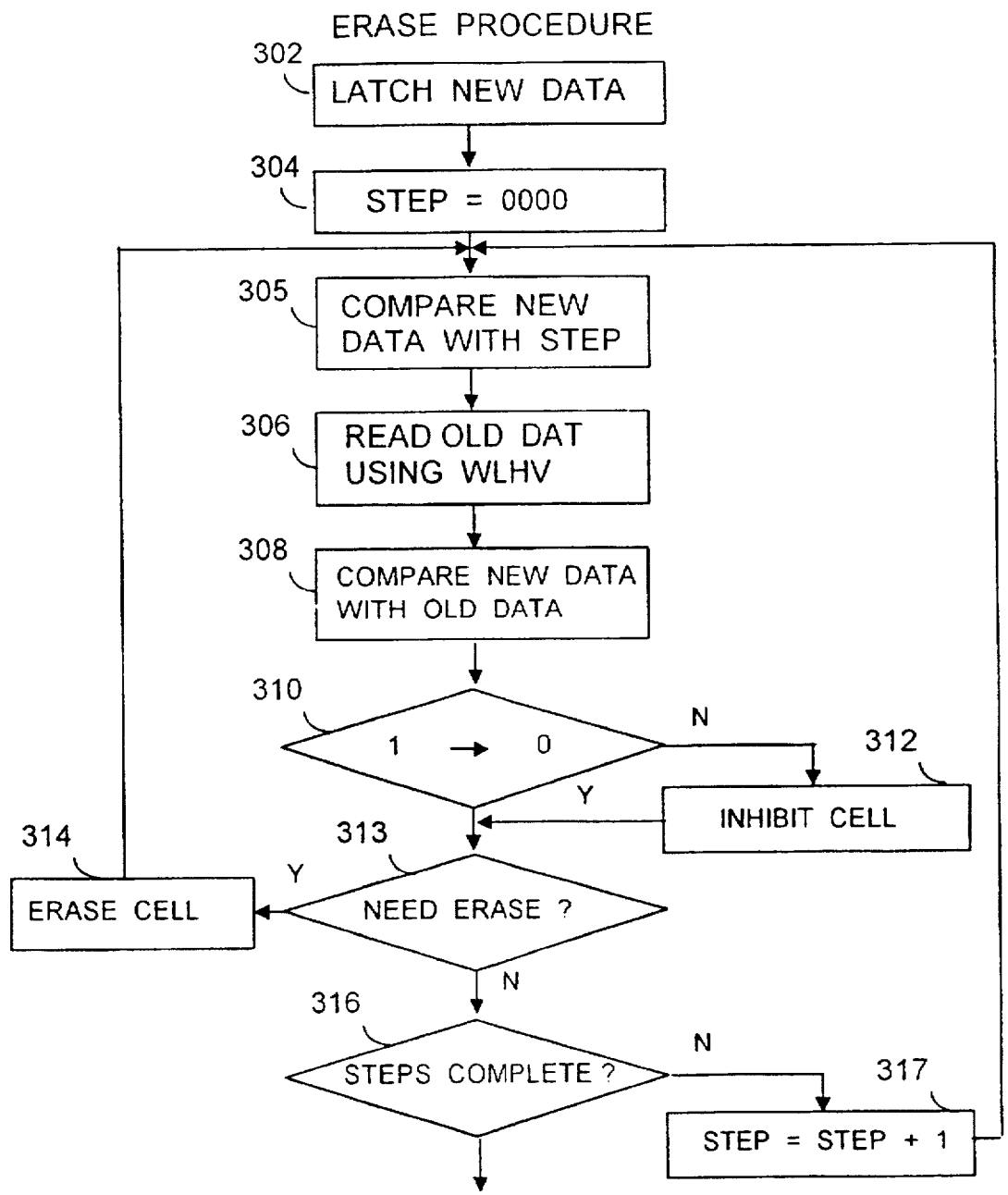
FIG. 13 is a flowchart showing the operation of the implementation of FIG. 12.
Figure 13B:
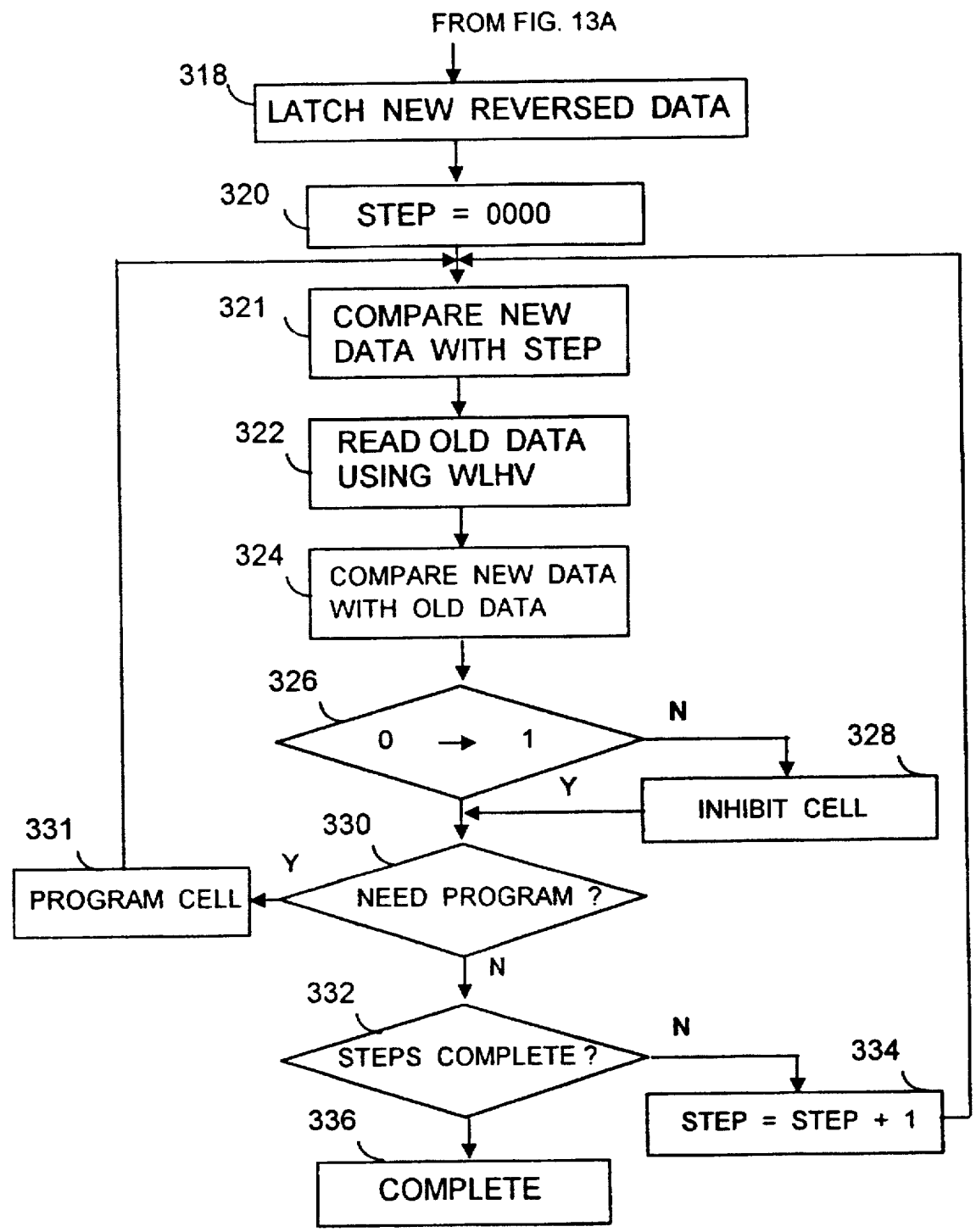

The operation of controller 226 is explained with reference to the FIG. 13 flowchart which describes a write procedure. The write procedure is broken into an erase procedure and a program procedure. Refer to Table 6 for the ERSVY and PGMVY states for the erase and program procedures. For the erase procedure, beginning with step 302, new data received from an external source and is latched in data latch 234. The exemplary embodiment is for a 16 state memory, so the data is D0–D3. Step counter is set to 1111 to initialize master latch 235 to the PTRN signal which is a 1 for the erase procedure initialization (after initialization, the PTRN signal is changed to 0). At erase procedure initialization, master latch 235 (N3) is set to 0. In step 304, step counter is reset to 0000.

In step 305, the new data is compared to the step count. Step counter 250 provides step count signals S0–S3 to level comparator 252 starting with a step count of 0000. Step counter 250 sends the step count to comparator 252 to determine whether to set master latch 235 (N3) from 0 to 1 (in order to disable erasing). This decision is based on the FIG. 14 pattern. The pattern is created by the comparison of step count (S0–S3) and the new data (D0–D3) based on the transistor configuration shown in comparator 252. This is equivalent to the boolean expression "(S0 OR D0) AND (S1 OR D1) AND (S2 OR D2) AND (S3 OR D3)." When the boolean expression is true (the pattern is satisfied), master latch 235 (N3) is set to !PTRN, which is 1 after initialization (PTRN=0, !PTRN=1), otherwise, latch 235 remains set at 0. The exclamation point (!) In front of the signal indicates the opposite state of the signal. Step 305 also involves turning on transistor 240 to pass the N3 signal from master latch 235 to slave latch 238 (N4=!N3).

In step 306, step counter 250 also sends the step count to voltage generator 254, which generates a wordline high voltage (WLHV) signal corresponding to the step count. For the erase procedure, when the step count is low, WLHV is high and when the step count is high, WLHV is low. Wordline decoder 14 applies the WLHV signal to the selected wordline and old data is internally read from memory. Depending on whether the WLHV signal exceeds the cell voltage threshold, the corresponding bitline is either left high or pulled low and sense amplifier 232 issues a corresponding data signal 1 or 0 respectively (N1).

In step 308, the value of master latch 235 (N3) is passed to slave latch 238 by activating transistor 240 (N4=!N3). Assuming that master latch 240 is still set to 0, slave latch 238 is set to 1 (affirmative erase). Step 310 determines if the memory cell must be erased to decrease the threshold (if N4=1). This is done using Table 6 where the old data (if N1=0 then N2=1) can reset slave latch 238 (to N4=0) if the cell is already at that state. This is called an inhibit erase and reflects the procedure of step 312. Step 313 confirms the erase procedure and verifies that prior erase procedures were properly performed. If step 313 confirms that the cell needs erasing, step 314 is performed which instructs the decoders to apply the erase voltages on selected wordlines, bitlines and sourcelines to erase the memory cell. If the cell is not erase inhibited the cell is erased. Step 316 determines whether all the steps are complete. If not, step 317 increments the step counter and returns the processing to step 305.

Figure 14:
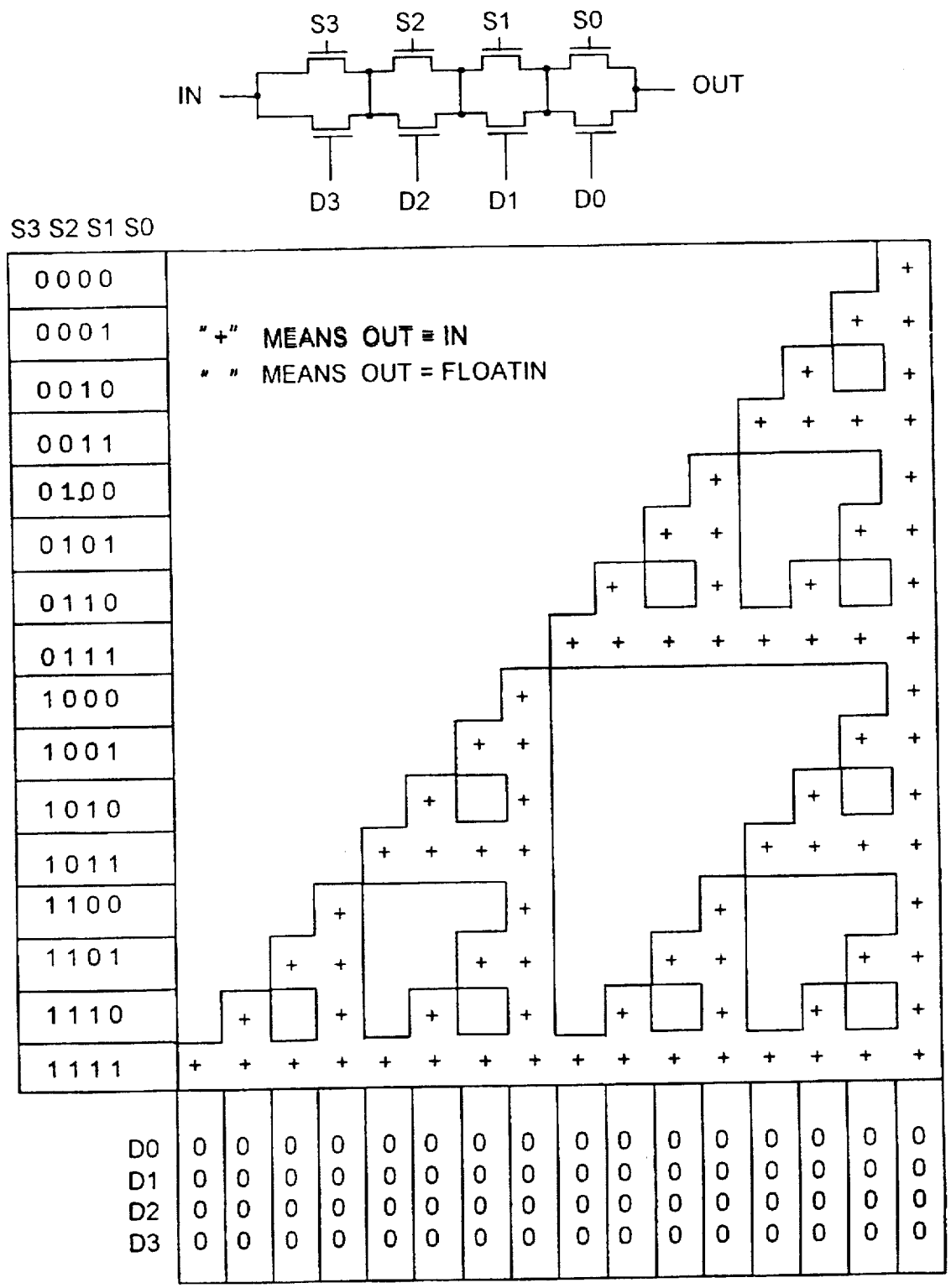
FIG. 14 is a write pattern according to an embodiment of the invention.

While the step counter is counting the steps and the WLHV signal is decreasing, several functions occur. When the WLHV threshold of the cell is not overcome and it must be erased, Table 6 will no longer inhibit the erase and the cell's threshold will be decreased. However, when the pattern shown in FIG. 14 is satisfied, master latch 235 (N4) will be set to !PTRN, which is 1 (PTRN=0 and !PTRN=1) after initialization. Once master latch 235 is set to 1, further erasing of the cell is inhibited.

In step 318, the data (D0–D3) is reversed to prepare for a program procedure. The data reverse is performed because the step count begins from 0000 to 1110 for both the erasing and programming. Therefore, for programming, the data is reversed to inhibit further programming when the target threshold is met. Operational examples given below further explain the rationale for the data reverse procedure.

To program the required cells, step 320 is performed to set step counter 250 to 1111 to initialize master latch 235 to the PTRN signal which is a 0 for the program procedure initialization (after initialization, the PTRN signal is changed to 1). At program procedure initialization, master latch 235 (N3) is set to 1. In step 304, step counter is reset to 0000.

In step 321, the new data is compared to the step count. Step counter 250 provides step count signals S0–S3 to level comparator 252 starting with a step count of 0000. Step counter 250 sends the step count to comparator 252 to determine whether to set master latch 235 (N3) from 1 to 0 (in order to disable programming). This decision is based on the FIG. 14 pattern. The pattern is created by the comparison of step count (S0–S3) and the reversed data (D0–D3) based on the transistor configuration shown in comparator 252. This is equivalent to the boolean expression "(S0 OR D0) AND (S1 OR D1) AND (S2 OR D2) AND (S3 OR D3)." When the boolean expression is true (the pattern is satisfied), master latch 235 (N3) is set to !PTRN, which is 0 after initialization (PTRN=1, !PTRN=0), otherwise, latch 235 remains set at 1. Step 321 also involves turning on transistor 240 to pass the N3 signal from master latch 235 to slave latch 238 (N4=!N3).

In step 322, step counter 250 also sends the step count to voltage generator 254, which generates a wordline high voltage (WLHV) signal corresponding to the step count. For the program procedure, when the step count is low, WLHV is low and when the step count is high, WLHV is high. Wordline decoder 14 applies the WLHV signal to the selected wordline and old data is internally read from memory. Depending on whether the WLHV signal exceeds the cell voltage threshold, the corresponding bitline is either left high or pulled low and sense amplifier 232 issues a corresponding data signal 1 or 0 respectively (N1).

In step 324, the value of master latch 235 (N3) is passed to slave latch 238 by activating transistor 240 (N4=!N3). Assuming that master latch 240 is still set to 1, slave latch 238 is set to 0 (affirmative program). Step 326 determines if the memory cell must be programmed to increase the threshold (if N4=0). This is done using Table 6 where the old data (if N1=1 then N2 =0) can set slave latch 238 (to N4=1) if the cell is already at that state. This is called an inhibit program and reflects the procedure of step 328. Step 330 confirms the program procedure and verifies that prior program procedures were properly performed. If step 330 confirms that the cell needs programming, step 331 is performed which instructs the decoders to apply the program voltages on selected wordlines, bitlines and sourcelines to program the memory cell. If the cell is not program inhibited the cell is programmed. Step 332 determines whether all the steps are complete. If not, step 334 increments the step counter and returns the processing to step 321. If so, step 334 passes the procedure to step 336 for completion.

While the step counter is counting the steps and the WLHV signal is increasing, several functions occur. When the WLHV threshold of the cell is overcome and it must be programmed, Table 6 will no longer inhibit the program and the cell's threshold will be increased. However, when the pattern shown in FIG. 14 is satisfied, master latch 235 (N4) will be set to !PTRN, which is 0 (PTRN=1 and !PTRN=0) after initialization. Once master latch 235 is set to 0, further programming of the cell is inhibited.

In an alternate technique, the program procedure can be performed first and the erase procedure second. The step count would similarly start from 0000. To accomplish this technique, the FIG. 13 flowchart would be modified to execute steps 318 though 334, then steps 302 through 317, and then step 336.

In order to more fully explain the multistate read/write controller 226, two examples are given with reference to FIGS. 15 and 16.

EXAMPLE 1

Figure 15A:
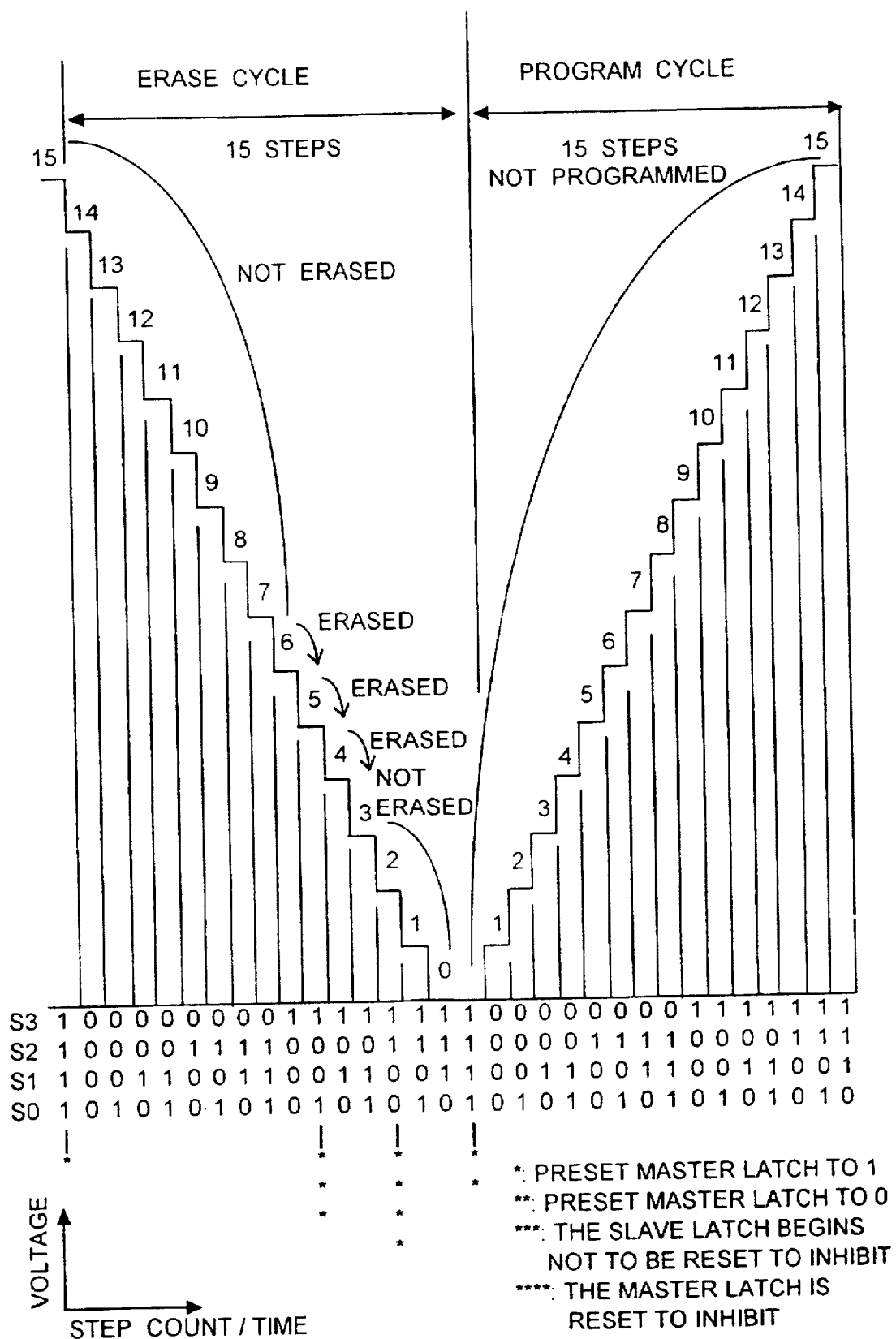
FIGS. 15A-B is a first example of a program procedure and an erase procedure performed according to an embodiment of the invention.
Figure 15B:
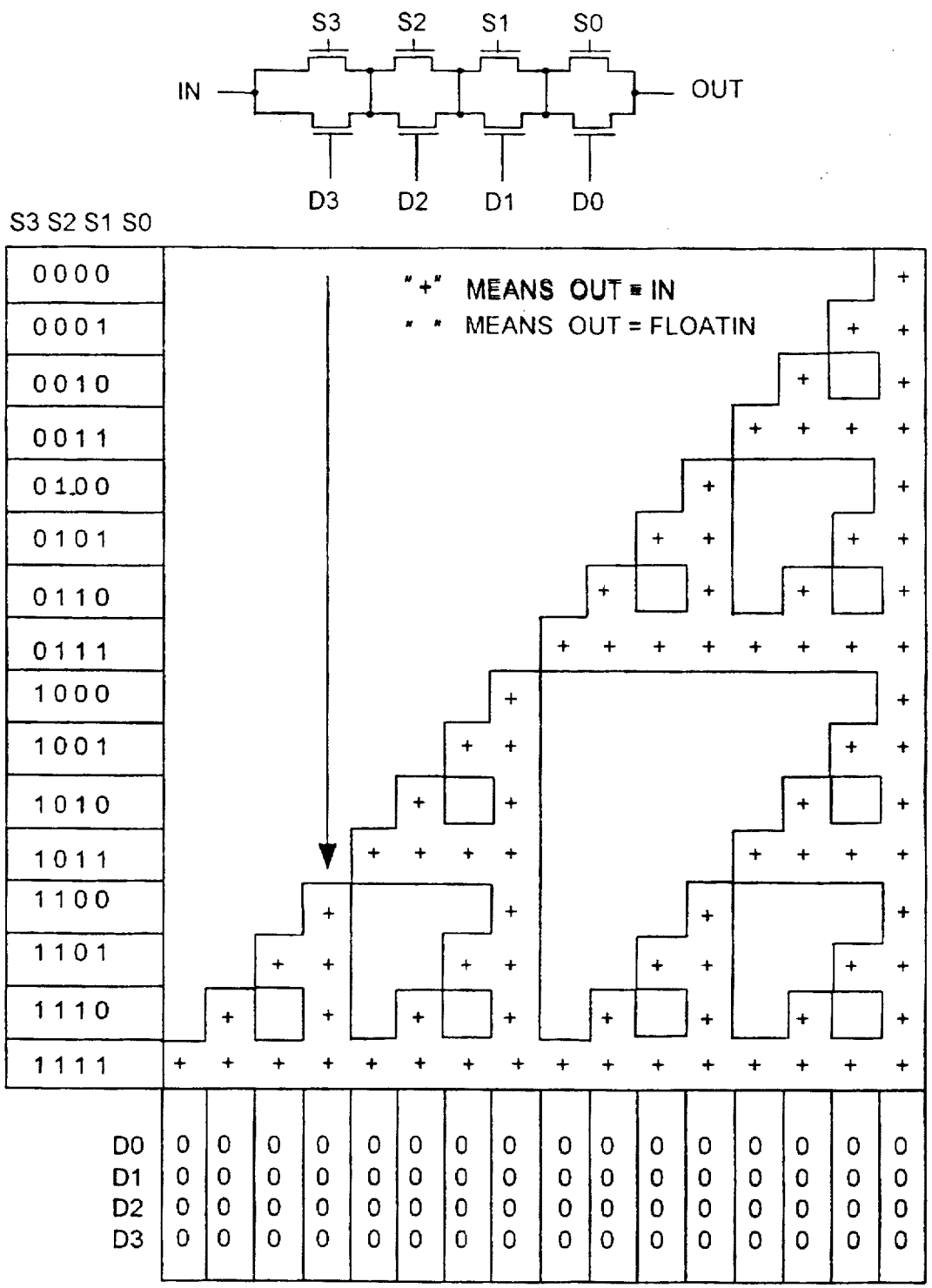

FIG. 15A depicts a memory cell voltage threshold where the old data is 6 (corresponding to step count 1000) and the new data is 3 (corresponding to step count 1011). FIG. 15B depicts the erase/program pattern for the given level comparator 252 transistors as shown in FIG. 12.

Read/write controller 226 is initialized for an erase procedure, as explained above. Master latch 235 is set to 0 and PGMVY, ERSVY are set as in Table 6 for erase. The new data 0011 (3=0011) is latched into data latch 234.

Step counter begins with step count 0000 and the WLHV signal is ramped from high to low. For the first nine steps (up to step count 1000), slave latch 238 is set to 1 by master latch 235 and is reset to 0 by comparator 236. At the tenth step (count 1001), slave latch is set to 1 by master latch 235, but is not reset by comparator 236. Thus, the cell is erased. This continues for three steps (up to count 1011). At this point, the boolean equation is satisfied and master latch is reset to 1. For the remaining steps, master latch sets slave latch to 0, which inhibits further erase. No program is conducted in this example because the cell only needed to have its threshold decreased. As a result, the correct data is stored in the selected cell.

EXAMPLE 2

Figure 16A:
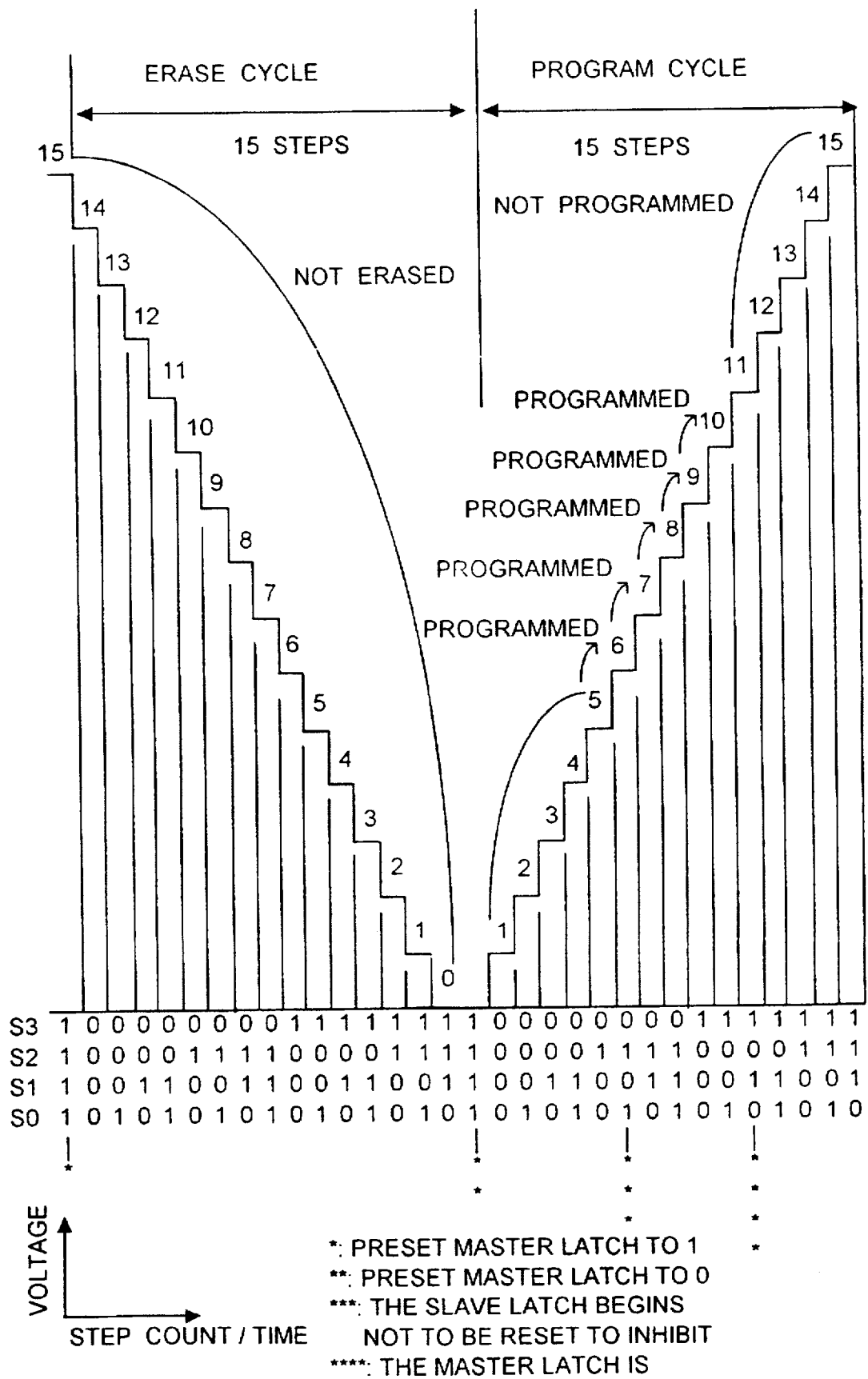
FIGS. 16A-B is a second example of a program procedure and an erase procedure performed according to an embodiment of the invention.
Figure 16B:
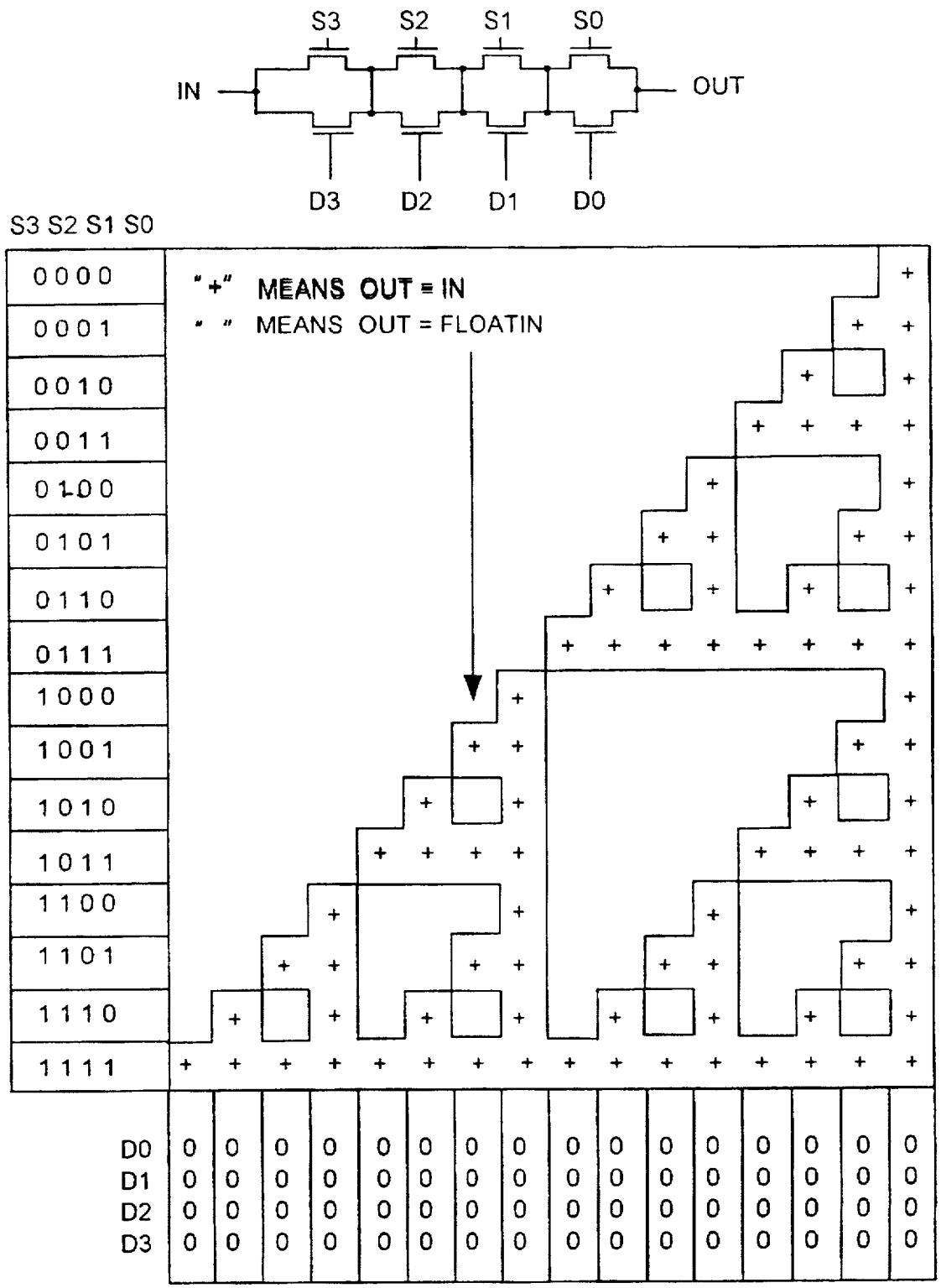

FIG. 16A depicts a memory cell voltage threshold where the old data is 5 (corresponding to step count 0100) and the new data is 10 (corresponding to step count 1001). FIG. 16B depicts the erase/program pattern for the given level comparator 252 transistors as shown in FIG. 12.

Read/write controller 226 is initialized for a program procedure, as explained above. Master latch 235 is set to 1 and PGMVY, ERSVY are set as in Table 6 for program. The reversed new data 0110 (10=1001) is latched into data latch 234.

Step counter begins with step count 0000 and the WLHV signal is ramped from low to high. For the first five steps (up to step count 0100), slave latch 238 is set to 0 by master latch 235 and is reset to 1 by comparator 236. At the sixth step (count 0101), slave latch is set to 0 by master latch 235, but is not reset by comparator 236. Thus, the cell is programmed. This continues for five steps (up to count 1001). At this point, the boolean equation is satisfied and master latch is reset to 0. For the remaining steps, master latch sets slave latch to 1, which inhibits further programming. No erase is conducted in this example because the cell only needed to have its threshold increased. As a result, the correct data is stored in the selected cell.

VERIFICATION

Figure 17:
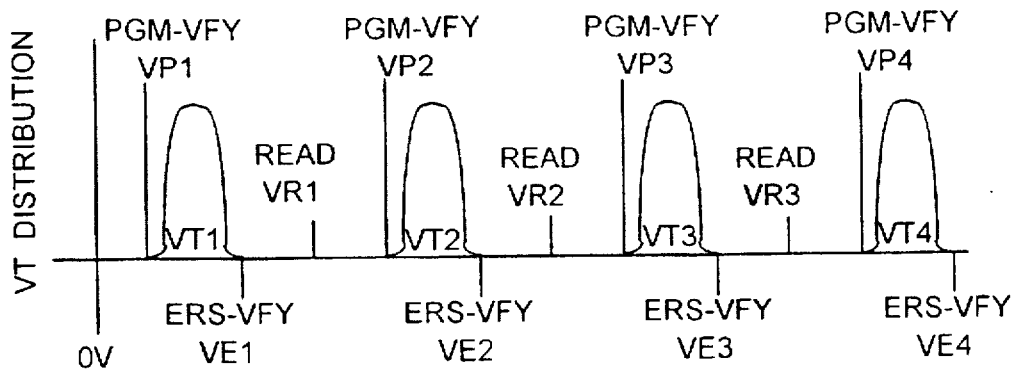
FIG. 17 illustrates the approximate voltage threshold levels for the various memory cells.

With regard to erase and program verification, the cells' Vt is verified in every step. Step 313 performs the erase verification, and step 330 performs the program verification. The cells passing the verification will reset the slave latch to inhibit erase or program by comparator 236. FIG. 17 depicts a range of thresholds for valid memory cell thresholds.

READ PROCEDURE

A read circuit 244 is shown in FIG. 12, and is for the read operation. In the read operation, transistor 242 is off, and signals ERSVY and PGMVY are both low. All the YB and YC pass gates are also off. Step counter 250 provides step count signals S0–S3 from 0000 to 1111 to the data bus B0–B3. Step counter 250 also sends the step count to voltage generator 254, which generates the wordline high voltage (WLHV) signal corresponding to the step count. For the read procedure, when the step count is low, WLHV is low and when the step count is high, WLHV is high. The WLHV signal is applied to the selected wordline to read the cells. The WLHV signal corresponding to the step count 0001 turns on the cells corresponding to data 0000 but will not turn on any cells corresponding to data 0001 or greater. Depending on whether the WLHV signal exceeds the cell threshold, the corresponding bitline is either left high or pulled low and sense amplifier 232 issues a corresponding data signal (N1) 1 or 0 respectively. The N1 signal controls the transistors 401a–d. When the N1 signal is 1, transistors 401a–d are on and when the N1 signal is 0, transistors 401a–d are off. The READ signal is corresponding to the step count as well as the WLHV signal. When the WLHV signal is increased for each step count and then after a delay, the READ signal is pulled high for a predetermined time to turn on transistors 400a–d. For the read procedure, the YB and YC pass gates are all off. Therefore, when the N1 signal is 1, corresponding to a cell off state, the step count S0–S3 sent to the data bus is loaded into the data latches 234. When the N1 signal is 0, corresponding to a cell on state, the step count S0–S3 sent to the data but B0–B3 is not loaded into data latches 234 because transistors 401a–d are off.

For example, when reading a cell at the state 5 (corresponding to data 0101), the first five steps (up to step count 0101), the output of sense amplifier 232 (N1) is 1 because the WLHV signals are lower than the cell threshold. The five step counts S0–S3 are loaded into the data latches 234 at every step and overwrite the previous data. The output of sense amplifier 232 starts to conduct signal low when the WLHV corresponds to step count 0101 and exceeds that step count. Then, the step count stored in data latch 234 is not changed. When the step count is up to 1111, all the cell's data is latched in the corresponding data latches 234. The data bus B0–B3 then is released from the control of step counter 250. The READ signal is low, and the YB and TC pass gates are sequentially turned on to read the data of the whole page based on byte. Because a page of data is read from the memory at one time, the read speed is high.

ALTERNATE READ/WRITE CONTROLLER EMBODIMENTS

Figure 18:
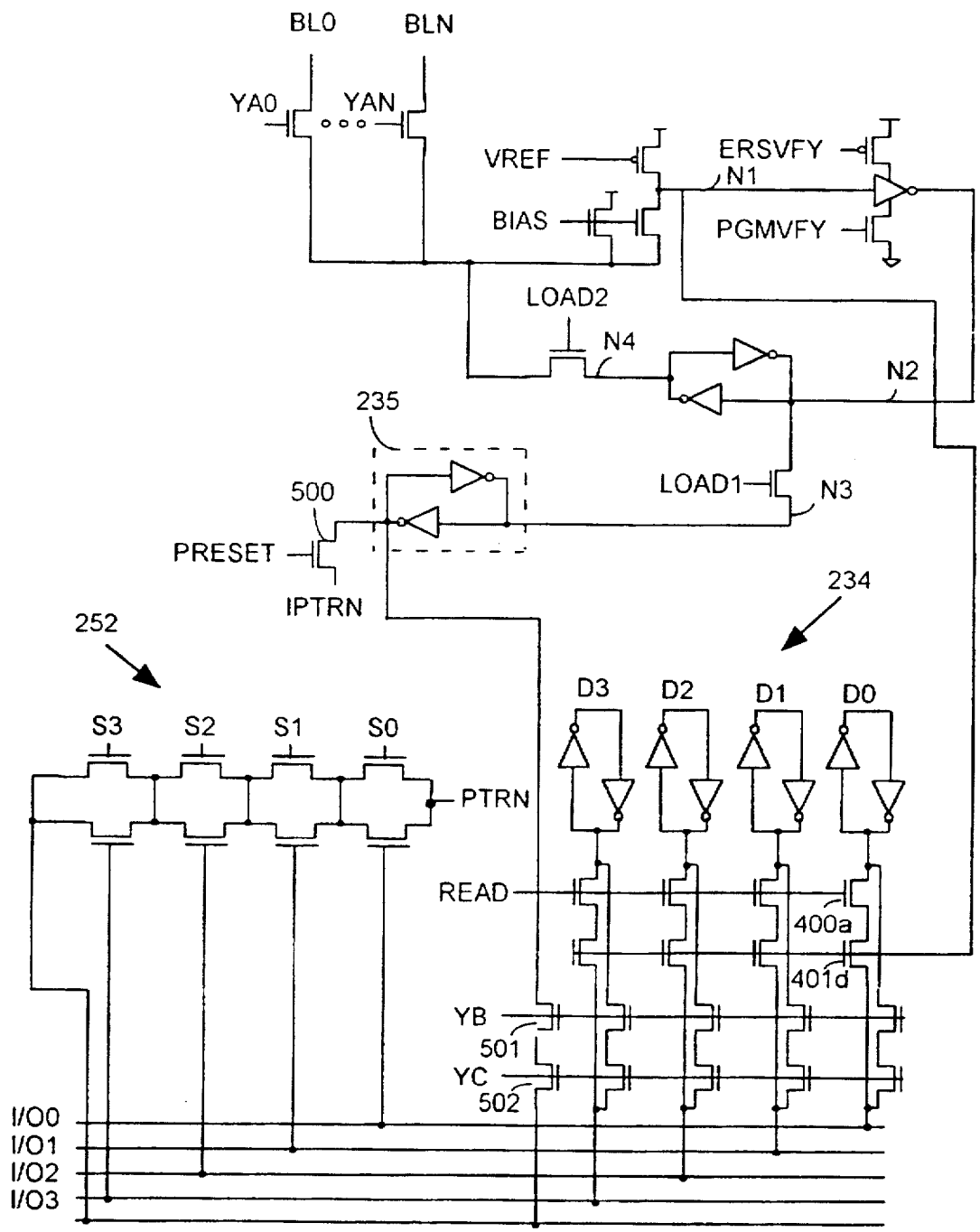
FIG. 18 depicts another implementation of the read/write controller of FIG. 11.

FIG. 18 depicts an alternative embodiment for level comparator 252 and data latch 234. This embodiment permits level comparator 252 to serve a large number of data latches 234 that may reflect a plurality of flash memory bitlines, bytes, words, banks or pages. For this embodiment, the erase/program pattern is the same as that shown in FIG. 14. In steps 304 and 320, the master latch 235 is initialized to !PTRN (in erasing !PTRN=1, in programming !PTRN=0) by turning on transistor 500. Then, in steps 305 and 321, the YB and YC pass gates are sequentially turned on to pass the data D0–D3 of latch 234 to level comparator 252. Step counter 250 provides step count signals S0–S3 to level comparator 252 starting from 0000. When the data and the step count match the pattern shown in FIG. 14, the master latch 235 of the selected bank is reset to PTRN (in erasing PTRN=0, in programming PTRN=1) to inhibit erase/program by turning on transistors 501 and 502; otherwise the master latch 235 remains at the initial affirmative state. Then, steps 306 and 322 shown in FIG. 13 are performed.

Figure 19:
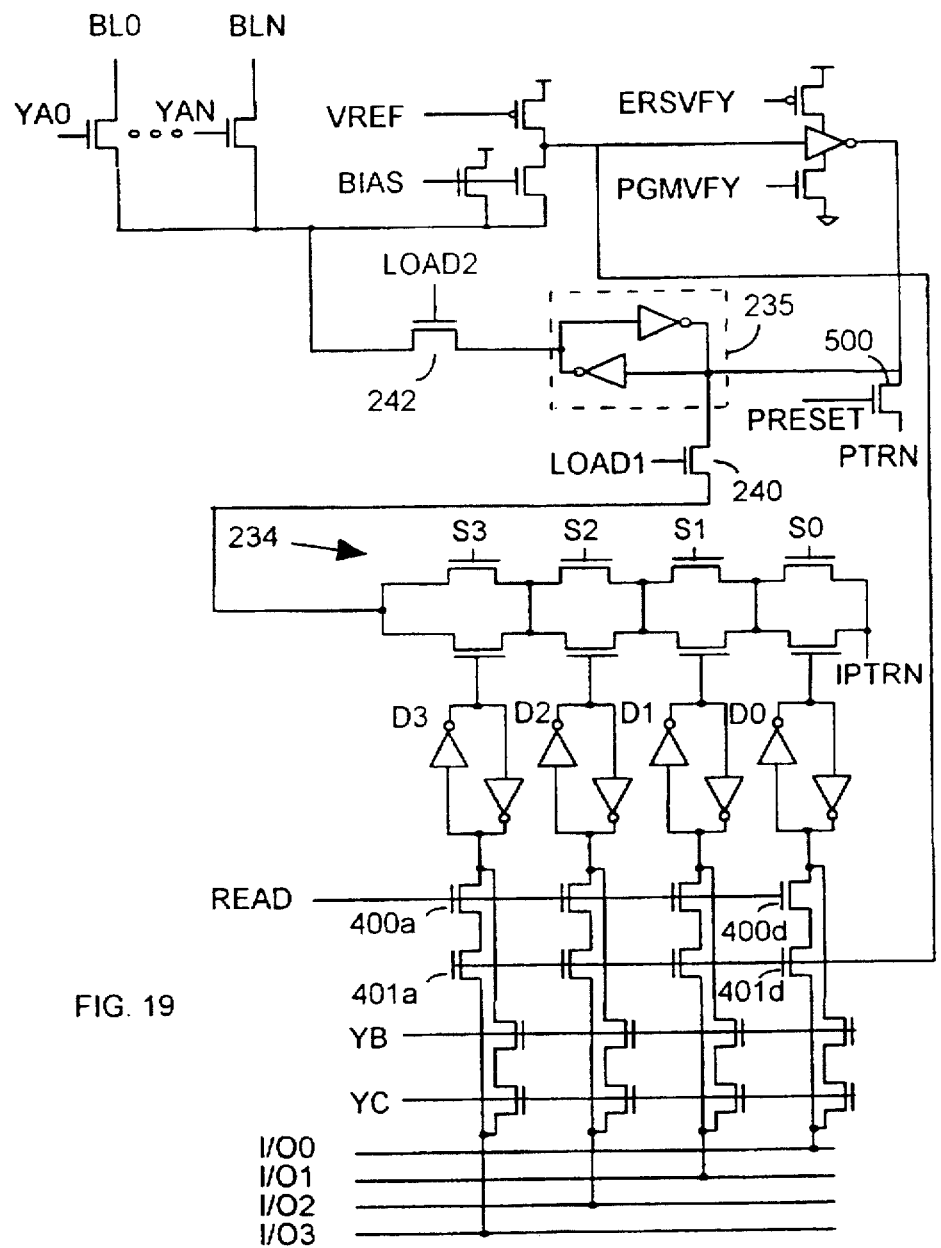
FIG. 19 depicts another implementation of the read/write controller of FIG. 11.

FIG. 19 depicts an alternative embodiment for slave latch 238. The circuit size is reduced when the master latch 235 is removed and only the slave latch 238 is used. For this embodiment, the erase/program pattern is the same as that shown in FIG. 14. In steps 304 and 320, the slave latch 238 is initialized to !PTRN (in erasing PTRN=0, in programming PTRN=1) by turning on transistor 500. Then, in steps 305 and 321, step counter 250 provides step count signals S0–S3 to level comparator 252 starting from 0000. When the data D0–D3 and the step count match the pattern shown in FIG. 14, the slave latch 238 is reset to PTRN (in erasing !PTRN= 1, in programming !PTRN=0) to inhibit erase/program by turning on transistor 240; otherwise, the slave latch remains at the affirmative state. Then, steps 306 and 321 shown in FIG. 13 are performed.

Figure 20A:
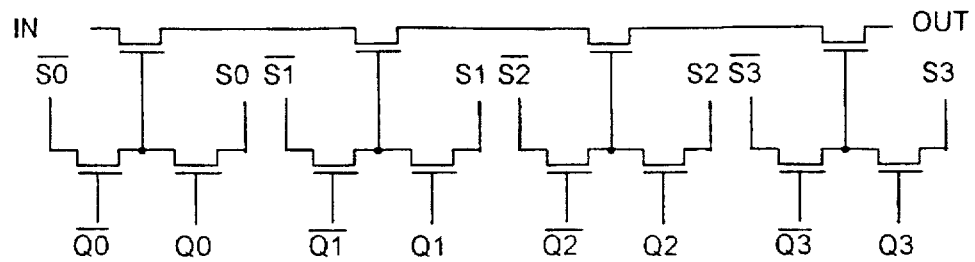
FIGS. 20A-B depict another implementation of a level comparator for the read/write controller of FIG. 12.
Figure 20B:
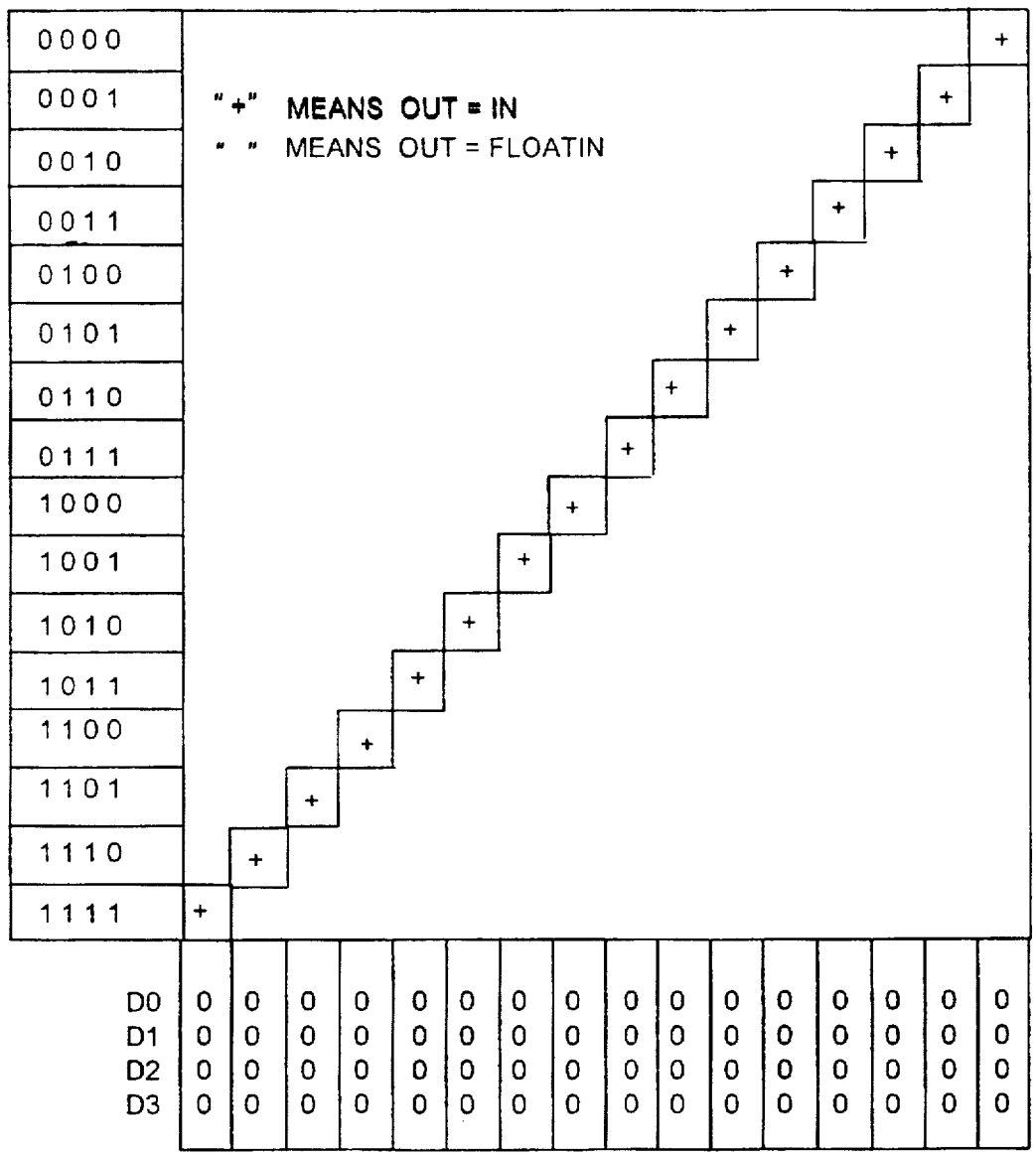

FIGS. 20A–B depict an alternative embodiment for level comparator 252. For this embodiment, the erase/program pattern is that shown in FIG. 20B. Note that the pattern is symmetrical. This is advantageous because no data reversal is needed in this embodiment. However, the step count is reversed in the erase and program procedures. For the erase procedure, in step 305, the step counter counts from 1111 to 0001. For the program procedure, in step 321, the step counter counts from 0000 to 1110.

Figures 21A, 21B:
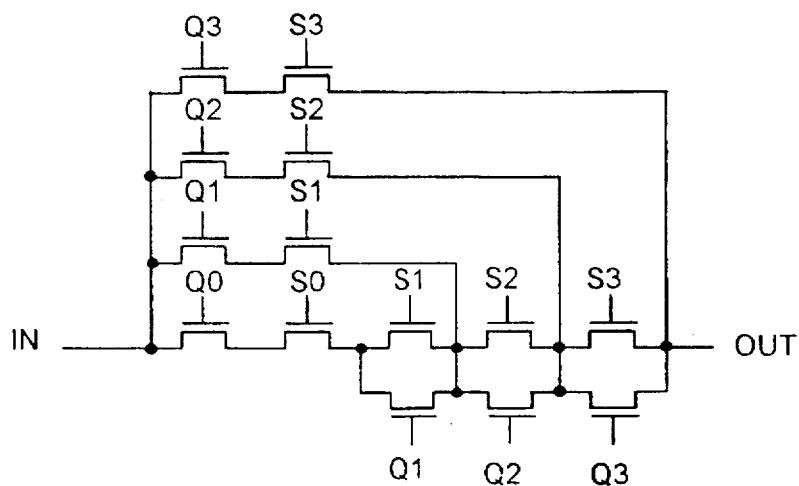
FIG. 21A-B depict another implementation of a level comparator for the read/write controller of FIG. 12.

FIGS. 21A–B depict an alternative embodiment for level comparator 252. For this embodiment, the erase/program pattern is that shown in FIG. 21B. Note that the pattern is symmetrical. Similar to the embodiment shown in FIGS. 20A–B, no data reversal is needed in this embodiment. However, in step 305, the step counter counts from 0000 to 1110, and in step 321, the step counter counts from 1111 to 0001.

Figures 22A, 22B:
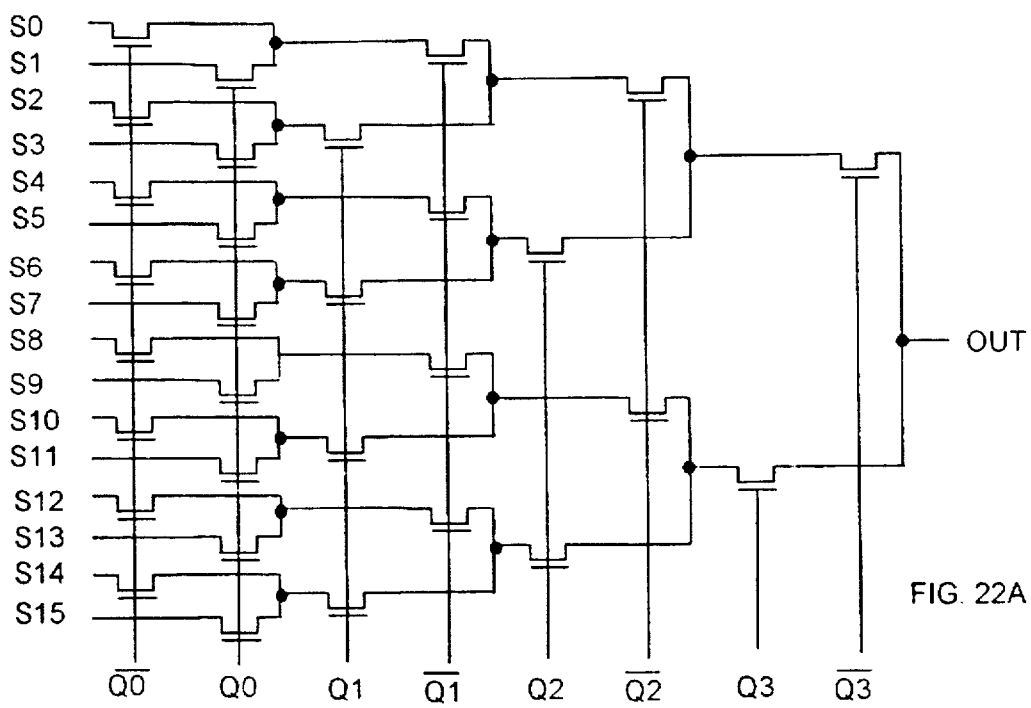
FIG. 22A-B depict another implementation of a level comparator for the read/write controller of FIG. 12.

FIGS. 22A–B depict an alternative embodiment for level comparator 252. For this embodiment, the erase/program pattern is that shown in FIG. 22B. Note that the pattern is symmetrical. Similar to the embodiment shown in FIGS. 20A–B, no data reversal is needed in this embodiment. In this embodiment, the step count signals S0–S15 are different from other embodiments. The pattern shown in FIG. 22B is the pattern of S0–S15 for every erase/program step. For example, the S0–S15 signals start counting from all 1 in erasing step 305, and start counting from all 0 in programming step 321.

Figures 23A, 23B:
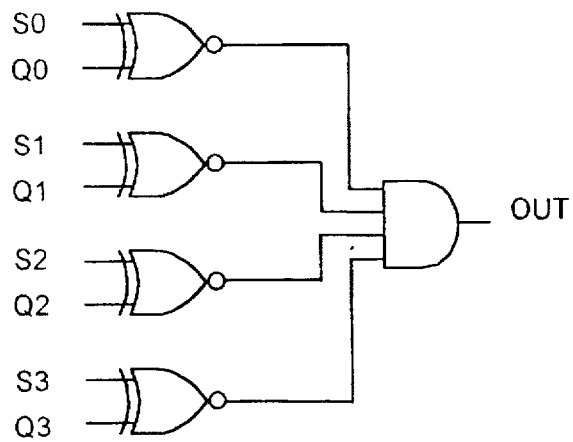
FIG. 23A-B depict another implementation of a level comparator for the read/write controller of FIG. 12.

FIGS. 23A–B depict an alternative embodiment for level comparator 252. For this embodiment, the erase/program pattern is that shown in FIG. 23B. Note that the pattern is symmetrical. This is advantageous because no data reversal is needed in this embodiment, since the erase and program procedures are automatically inhibited at the correct data value. Similar to the embodiment shown in FIG. 12, the present embodiment can be used as the level comparator in the embodiments shown in FIGS. 18 and 19. The embodiments shown in FIGS. 20A, 21A, 22A and 23A can also be altered by using level comparator 252 to serve a large number of data latches 234, or to use only slave latch 238 without master latch 235 to store the erase/program pattern.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3 V), and needs VPP(+10 V) for a program function, the voltage pump generator creates the needed voltage and provides it to the decoder circuits to accomplish the necessary function. Likewise, the voltage pump can provide a negative voltage VPN(−10 V) to the decoder circuits for the erase function.

BLOCK ERASE/PROGRAM OPTION

The invention provides high flexibility for the erase/program procedures. With the invention, a flash memory can be bit-selectively erased and bit-selectively programmed. However, for some applications that favor block (page) erase procedures, the invention can also be used. With a block erase, all the bit lines are set to 1 by the bitline decoder in order to erase the entire block. After the block is erased, the cells are bit-selectively programmed. Similarly, for some applications that favor block (page) program procedures, the invention can also be used. With a block program, all the bit lines are set to 0 by the bitline decoder in order to program the entire block. After the block is programmed, the cells are bit-selectively erased.

CONCLUSION

The invention provides many advantages over known techniques. The invention reduces program time. In a typical flash memory, the entire array is erased and re-programmed, which is a time-consuming procedure. Even when a page-erase feature is provided, the entire page is erased and re-programmed, which is also time-consuming. The invention provides a fast and convenient way to erase/program only those portions that need to be erased/programmed. The invention reduces time and provides improves processor access to the flash memory.

The invention also improves the longevity of the flash memory. Since only the portions that require re-programming are erased, stress on the flash memory cells is reduced. As a result, the invention can provide a large number of operable erase/program cycles, such as $10^6$ erase/program cycles, in a flash memory. Additionally, the read/write controller can also be used in a flash memory for conventional block (page) erasing and programming. It provides high flexibility for the users. Finally, flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flash memory read/write controller for use with a flash memory including a flash transistor array, a wordline decoder, a bitline decoder and a sourceline decoder, said controller comprising:

a voltage terminal to receive an input voltage;

a data terminal to receive a new data signal;

a sense amplifier coupled to said bitline decoder and configured to sense a signal on a selected bitline and to generate an old data signal;

a data comparator coupled to said data terminal and said sense amplifier and configured to compare said new data signal to said old data signal and to generate a comparator signal; and a voltage generator coupled to said voltage terminal, said wordline decoder, said bitline decoder and said sourceline decoder and configured to selectively provide a read set of voltages to read a selected cell in said flash transistor array, a program set of voltages to program a selected cell in said flash transistor array and an erase set of voltages to erase a selected cell in said flash transistor array; and wherein said wordline decoder, said bitline decoder and said sourceline decoder are configured to selectively apply said voltages based at least in part on said comparator signal.

2. The flash memory read/write controller of claim 1, further comprising:

a second data terminal to receive a second new data signal;

a second sense amplifier coupled to said bitline decoder and configured to sense a signal on a second selected bitline and to generate a second old data signal;

a second data comparator coupled to said second data terminal and said second sense amplifier and configured to compare said second new data signal to said second old data signal and to generate a second comparator signal; and wherein said voltage generator is configured to selectively provide a read set of voltages to read a second selected cell in said flash transistor array, a program set of voltages to program a second selected cell in said flash transistor array and an erase set of voltages to erase a second selected cell in said flash transistor array; and wherein said wordline decoder, said bitline decoder and said sourceline decoder are configured to selectively apply said voltages based at least in part on said second comparator signal.

3. The flash memory read/write controller of claim 1, wherein said data comparator includes:

a master latch coupled to said data terminal and configured to latch said new data signal; and a slave latch coupled to said master latch and configured to selectively receive said new data signal and to set or reset based on said comparator signal.

4. The flash memory read/write controller of claim 2, wherein:

said data comparator includes:
a master latch coupled to said data terminal and configured to latch said new data signal; and
a slave latch coupled to said master latch and configured to selectively receive said new data signal and to set or reset based on said comparator signal; and said second data comparator includes:
a second master latch coupled to said second data terminal and configured to latch said second new data signal; and
a second slave latch coupled to said second master latch and configured to selectively receive said second new data signal and to set or reset based on said second comparator signal.

5. The flash memory read/write controller of claim 1, further comprising:

a step counter coupled to said comparator and said voltage generator and configured to generate a step count; and wherein said voltage generator is configured to generate a wordline high voltage (WLHV) signal based on said step count; and wherein said read set of voltages includes said WLHV signal.

6. The flash memory read/write controller of claim 5, further comprising:

a second data terminal to receive a second new data signal;

a second sense amplifier coupled to said bitline decoder and configured to sense a signal on a second selected bitline and to generate a second old data signal;

a second data comparator coupled to said second data terminal and said second sense amplifier and configured to compare said second new data signal to said second old data signal and to generate a second comparator signal; and wherein said voltage generator is configured to selectively provide a read set of voltages to read a second selected cell in said flash transistor array, a program set of voltages to program a second selected cell in said flash transistor array and an erase set of voltages to erase a second selected cell in said flash transistor array; and wherein said wordline decoder, said bitline decoder and said sourceline decoder are configured to selectively apply said voltages based at least in part on said second comparator signal.

7. The flash memory read/write controller of claim 5, wherein said data comparator includes:

a master latch coupled to said data terminal and configured to latch said new data signal; and a slave latch coupled to said master latch and configured to selectively receive said new data signal and to set or reset based on said comparator signal.

8. The flash memory read/write controller of claim 6, wherein:

said data comparator includes:
a master latch coupled to said data terminal and configured to latch said new data signal; and
a slave latch coupled to said master latch and configured to selectively receive said new data signal and to set or reset based on said comparator signal; and said second data comparator includes:
a second master latch coupled to said second data terminal and configured to latch said second new data signal; and
a second slave latch coupled to said second master latch and configured to selectively receive said second new data signal and to set or reset based on said second comparator signal.

9. A method of manufacturing a flash memory read/write controller in a flash memory having a voltage terminal to receive an input voltage and a data terminal to receive new data, said method comprising the steps of:

coupling a wordline decoder to a flash transistor array;
coupling a bitline decoder to said flash transistor array;
coupling a sourceline decoder to said flash transistor array;
coupling a sense amplifier to said bitline decoder;
coupling a data comparator to said data terminal and said sense amplifier; and
coupling a voltage generator to said voltage terminal, said wordline decoder, said bitline decoder and said sourceline decoder.

10. The method of claim 9, wherein said step of coupling a data comparator includes the steps of:

coupling a master latch to said data terminal; and
coupling a slave latch to said master latch and said sense amplifier.

11. The method of claim 10, further comprising the step of:

coupling a step counter to said voltage generator and said data comparator.

12. The method of claim 9, further comprising the step of:

coupling a step counter to said voltage generator and said data comparator.

13. A method of reading and writing data in a flash memory having a flash transistor array, a wordline decoder, a bitline decoder and a sourceline decoder, said method comprising the steps of:

receiving an input voltage;
receiving a new data signal
reading old data from said flash transistor array and generating an old data signal;
comparing said new data signal to said old data signal and generating a comparator signal;
selectively providing a read set of voltages to read a selected cell in said flash transistor array, a program set of voltages to program a selected cell in said flash transistor array and an erase set of voltages to erase a selected cell in said flash transistor array, and selectively applying said voltages based at least in part on said comparator signal.

14. The method of claim 13, further comprising the steps of:

receiving a second new data signal;

reading second old data from said flash transistor array and generating a second old data signal;

comparing said second new data signal to said second old data signal and generating a second comparator signal;

selectively providing a read set of voltages to read a second selected cell in said flash transistor array, a program set of voltages to program a second selected cell in said flash transistor array and an erase set of voltages to erase a second selected cell in said flash transistor array; and selectively applying said voltages based at least in part on said second comparator signal.

15. The method of claim 14, wherein:

said comparing said new data step includes the steps of:
latching said new data signal and generating a latch signal; and
selectively setting or resetting said latch signal based on said comparator signal; and said comparing said second new data step includes the steps of:
latching said second new data signal and generating a second latch signal; and
selectively setting or resetting said latch signal based on said second comparator signal.

16. The method of claim 13, wherein said comparing step includes the steps of:

latching said new data signal and generating a latch signal; and selectively setting or resetting said latch signal based on said comparator signal.

17. The method of claim 13, further comprising the steps of:

providing a plurality of step counts;

generating a wordline high voltage (WLHV) signal based on said step count;

applying said WLHV signal to said flash transistor array to read a selected cell.

18. The method of claim 17, further comprising the steps of:

receiving a second new data signal;

reading second old data from said flash transistor array and generating a second old data, signal;

comparing said second new data signal to said second old data signal and generating a second comparator signal;

selectively providing a read set of voltages to read a second selected cell in said flash transistor array, a program set of voltages to program a second selected cell in said flash transistor array and an erase set of voltages to erase a second selected cell in said flash transistor array; and selectively applying said voltages based at least in part on said comparator signal.

19. The method of claim 18, wherein:

said comparing said new data step includes the steps of:
latching said new data signal and generating a latch signal; and
selectively setting or resetting said latch signal based on said comparator signal; and said comparing said second new data step includes the steps of:
latching said second new data signal and generating a second latch signal; and
selectively setting or resetting said latch signal based on said second comparator signal.

20. The method of claim 19, wherein:

said comparing said new data step further includes the steps of:
latching a reverse of said new data signal and generating a reverse latch signal; and
selectively setting or resetting said reverse latch signal based on said comparator signal; and said comparing said second new data step includes the steps of:
latching a reverse of said second new data signal and generating a second reverse latch signal; and
selectively setting or resetting said reverse latch signal based on said second comparator signal.

21. The method of claim 17, wherein said comparing step includes the steps of:

latching said new data signal and generating a latch signal; and selectively setting or resetting said latch signal based on said comparator signal.

22. The method of claim 19, wherein said comparing step further includes the steps of:

latching a reverse of said new data signal and generating a reverse latch signal; and selectively setting or resetting said reverse latch signal based on said comparator signal.

* * * * *